(12) United States Patent
Chu et al.

(10) Patent No.: US 9,725,301 B2
(45) Date of Patent: *Aug. 8, 2017

(54) STRUCTURES AND FORMATION METHODS OF MICRO-ELECTRO MECHANICAL SYSTEM DEVICE

(71) Applicant: TAIWAN SEMICONDUCTOR MANUFACTURING CO., LTD., Hsin-Chu (TW)

(72) Inventors: Chia-Hua Chu, Zhubei (TW); Chun-Wen Cheng, Zhubei (TW); Shang-Ying Tsai, Pingzhen (TW); Chin-Wei Liang, Zhubei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/525,827

(22) Filed: Oct. 28, 2014

(65) Prior Publication Data

US 2015/0137280 A1 May 21, 2015

Related U.S. Application Data

(63) Continuation-in-part of application No. 14/276,295, filed on May 13, 2014, now Pat. No. 9,567,206.
(Continued)

(51) Int. Cl.
*B81B 7/02* (2006.01)
*H01L 29/84* (2006.01)
(Continued)

(52) U.S. Cl.
CPC ............. *B81B 7/0038* (2013.01); *B81B 7/02* (2013.01); *B81C 1/00238* (2013.01)

(58) Field of Classification Search
CPC ....... H01L 21/02; H01L 29/84; B81B 7/0038; B81B 7/02; B81B 7/0041; B81C 1/00293; B81C 1/00238
See application file for complete search history.

(56) References Cited

U.S. PATENT DOCUMENTS 7,659,150 B1 * 2/2010 Monadgemi ........ B81C 1/00293
257/E23.193
8,350,346 B1 * 1/2013 Huang .................. B81B 3/0051
257/414

(Continued)

*Primary Examiner* — Fazli Erdem
(74) *Attorney, Agent, or Firm* — Birch, Stewart, Kolasch & Birch, LLP

(57) ABSTRACT

A structure and a formation method of a micro-electro mechanical system (MEMS) device are provided. The MEMS device includes a cap substrate and a MEMS substrate bonded with the cap substrate. The MEMS substrate includes a first movable element and a second movable element. The MEMS device also includes a first enclosed space surrounded by the MEMS substrate and the cap substrate, and the first movable element is in the first enclosed space. The MEMS device further includes a second enclosed space surrounded by the MEMS substrate and the cap substrate, and the second movable element is in the second enclosed space. In addition, the MEMS device includes a pressure-changing layer in the first enclosed space.

20 Claims, 50 Drawing Sheets

Related U.S. Application Data which is a continuation-in-part of application No. 14/084,161, filed on Nov. 19, 2013, now Pat. No. 9,487,391.

(51) Int. Cl.
*H01L 21/02* (2006.01)
*B81B 7/00* (2006.01)
*B81C 1/00* (2006.01)

(56) References Cited

U.S. PATENT DOCUMENTS

| | | | |
|---|---|---|---|
| 9,487,391 B2 * | 11/2016 | Cheng | B81C 1/00293 |
| 2008/0284682 A1 | 11/2008 | Oh et al. | |
| 2009/0134459 A1 | 5/2009 | Goto et al. | |
| 2009/0294879 A1 * | 12/2009 | Bhagavat | B81C 1/00269 |
| | | | 257/415 |
| 2011/0048129 A1 * | 3/2011 | Yamanaka | B81B 7/02 |
| | | | 73/504.12 |
| 2011/0051312 A1 * | 3/2011 | Steeneken | B81B 3/0078 |
| | | | 361/281 |
| 2012/0142144 A1 | 6/2012 | Taheri | |
| 2012/0326248 A1 * | 12/2012 | Daneman | B81B 7/02 |
| | | | 257/415 |
| 2013/0193527 A1 | 8/2013 | Chu et al. | |
| 2013/0283912 A1 | 10/2013 | Lin | |
| 2013/0334621 A1 | 12/2013 | Classen et al. | |
| 2014/0015069 A1 | 1/2014 | Liang et al. | |
| 2014/0151820 A1 * | 6/2014 | Howe | H01L 23/3171 |
| | | | 257/415 |
| 2014/0225206 A1 | 8/2014 | Lin et al. | |
| 2014/0227816 A1 | 8/2014 | Zhang et al. | |
| 2015/0061046 A1 | 3/2015 | Chang et al. | |
| 2015/0091153 A1 | 4/2015 | Liu et al. | |
| 2015/0097215 A1 * | 4/2015 | Chu | B81C 1/00238 |
| | | | 257/254 |
| 2015/0097253 A1 * | 4/2015 | Tsau | B81B 7/0038 |
| | | | 257/415 |
| 2015/0210541 A1 * | 7/2015 | Kang | B81B 7/0038 |
| | | | 257/415 |
| 2015/0329351 A1 * | 11/2015 | Cheng | B81B 7/007 |
| | | | 257/417 |

* cited by examiner

STRUCTURES AND FORMATION METHODS OF MICRO-ELECTRO MECHANICAL SYSTEM DEVICE

PRIORITY CLAIM AND CROSS-REFERENCE

This application is a Continuation-In-Part of pending U.S. patent application Ser. No. 14/276,295, filed May 13, 2014 and entitled "Structures and formation methods of micro-electro mechanical system device", which is a Continuation-In-Part of pending U.S. patent application Ser. No. 14/084,161, filed Nov. 19, 2013 and entitled "MECHANISMS FOR FORMING MICRO-ELECTRO MECHANICAL SYSTEM DEVICE". The entire of U.S. patent application Ser. No. 14/276,295 and U.S. patent application Ser. No. 14/084,161 are incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Micro-electro mechanical system (MEMS) devices have recently been developed. MEMS devices include devices fabricated using semiconductor technology to form mechanical and electrical features. The MEMS devices may include a number of elements (e.g., movable elements) for achieving mechanical functionality.

MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications may extend to optical applications, such as movable mirrors, and radio frequency (RF) applications, such as RF switches or the like.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
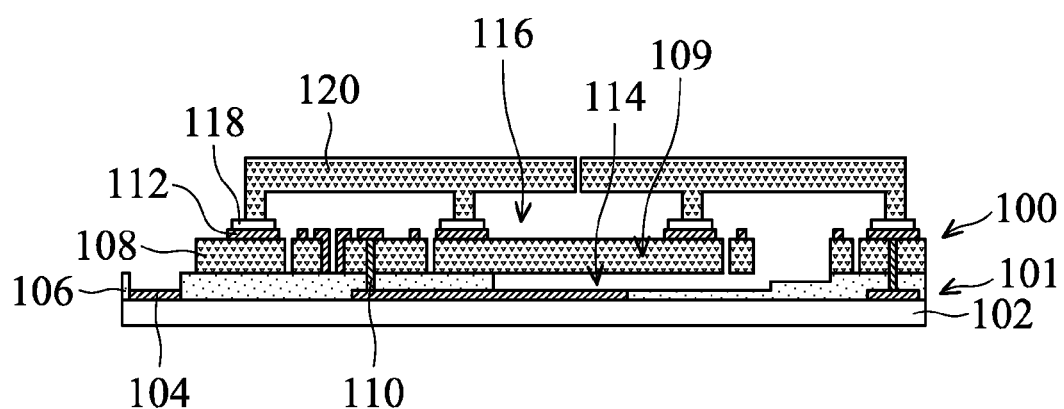
FIG. 1 is a cross-sectional view of a MEMS device, in accordance with some embodiments.
Figure 2A:
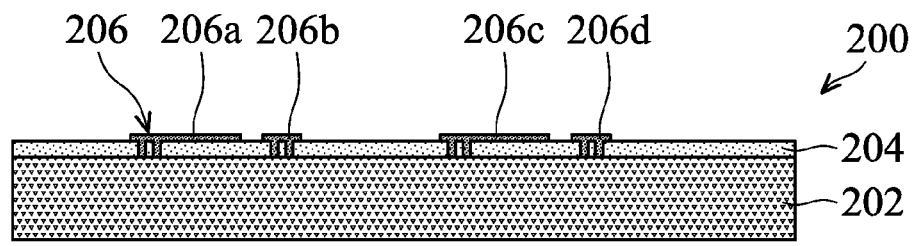
FIGS. 2A-2Q are cross-sectional views of various stages of a process for forming a MEMS device, in accordance with some embodiments.
Figure 2B:
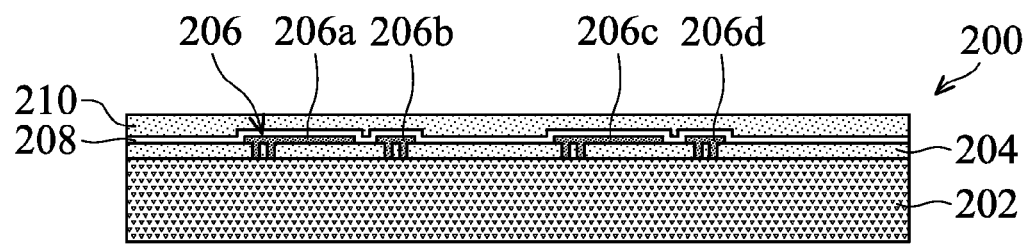
Figure 2C:
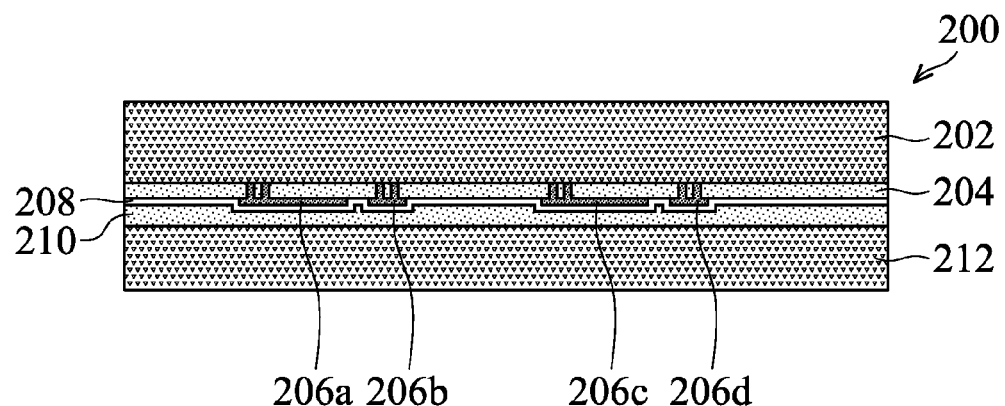
Figure 2D:
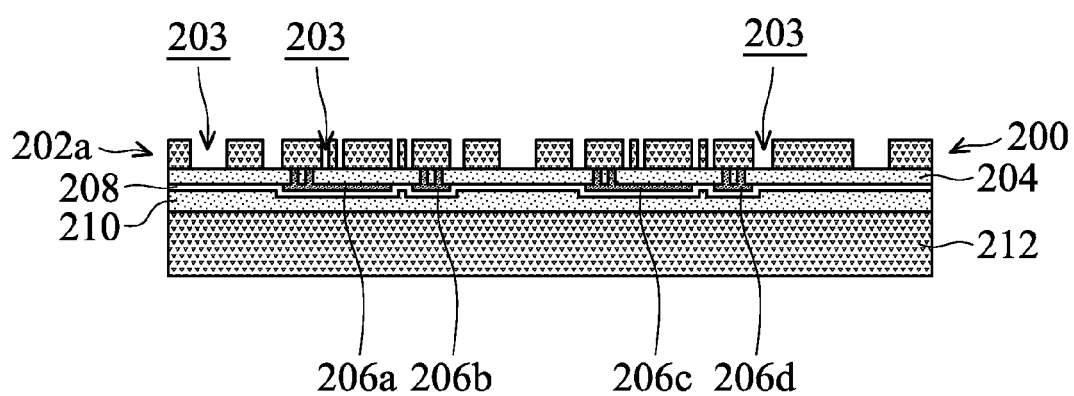
Figure 2E:
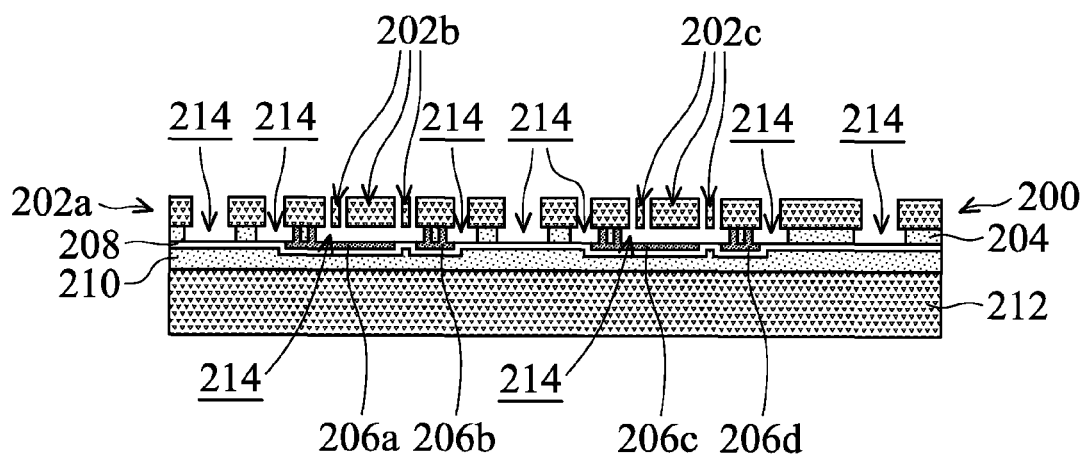
Figure 2F:
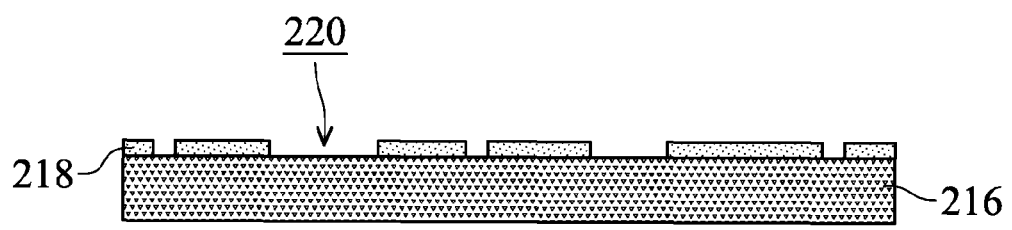
Figure 2G:
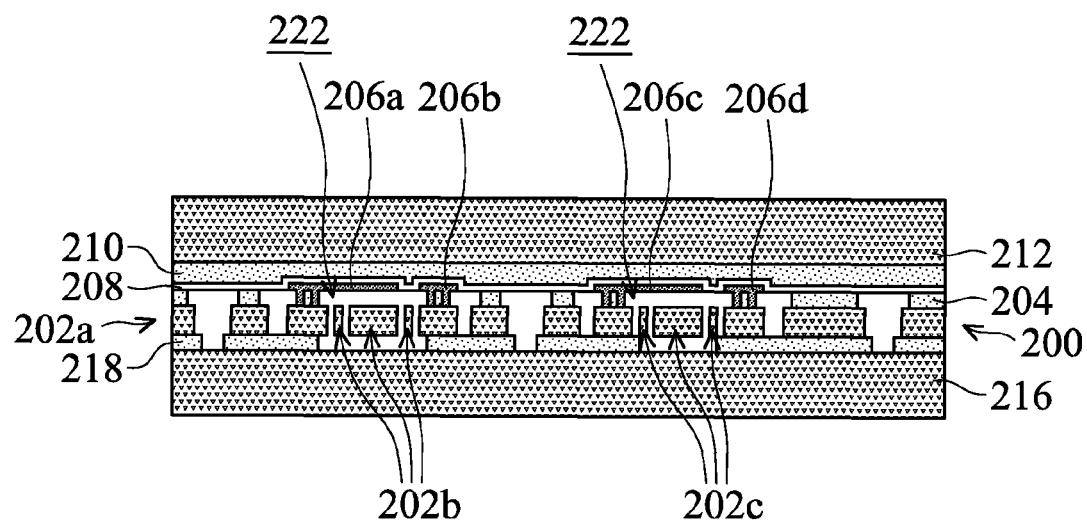
Figure 2H:
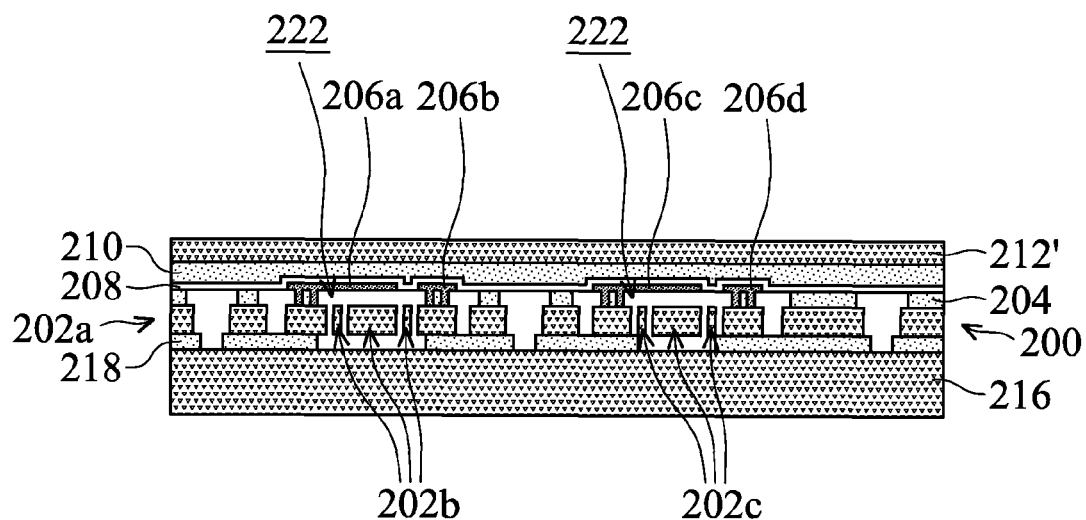
Figure 2I:
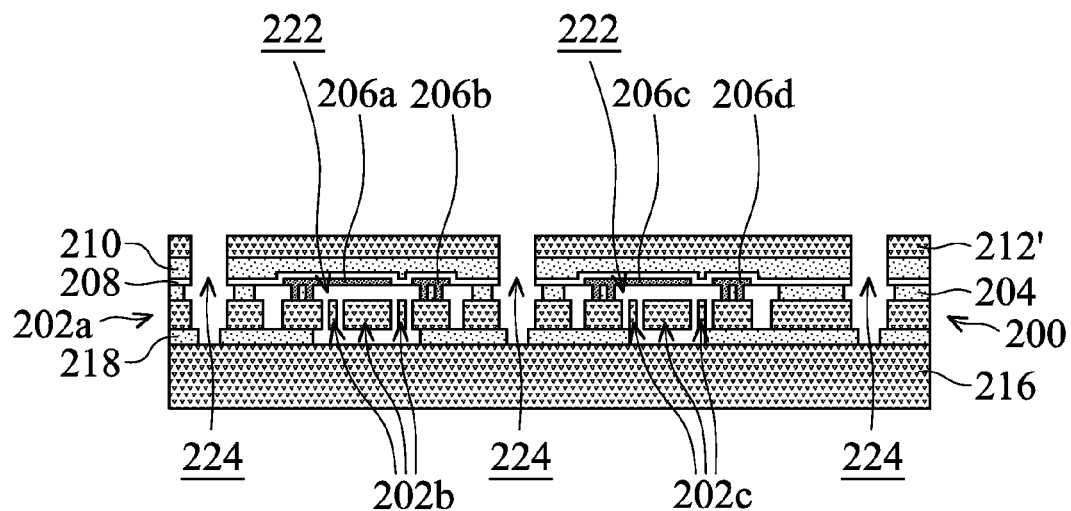
Figure 2J:
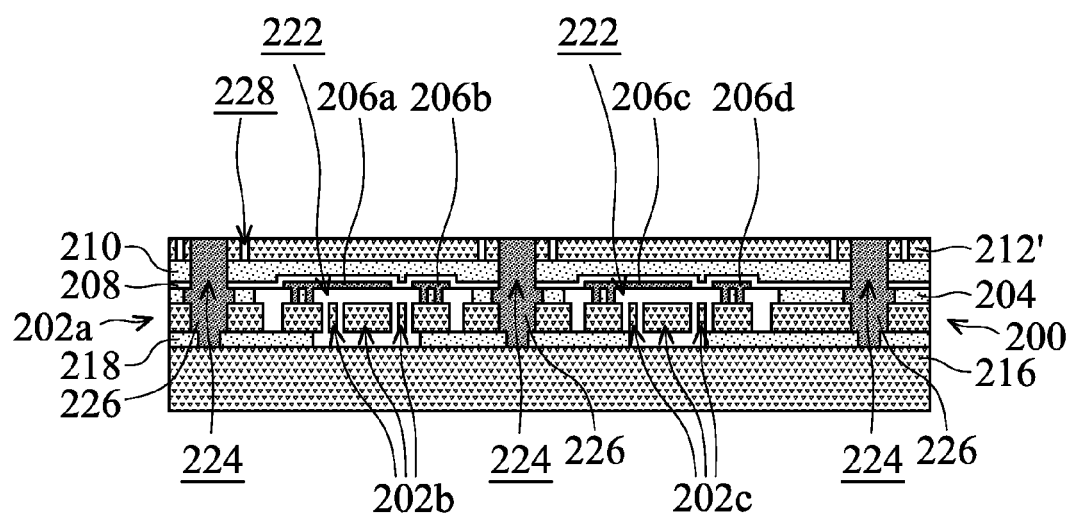
Figure 2K:
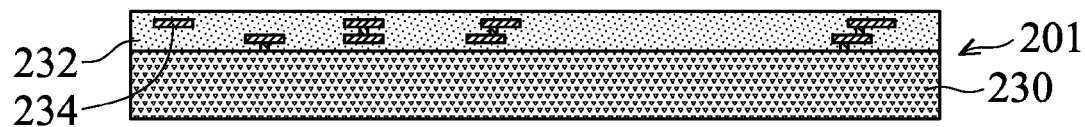
Figure 2L:
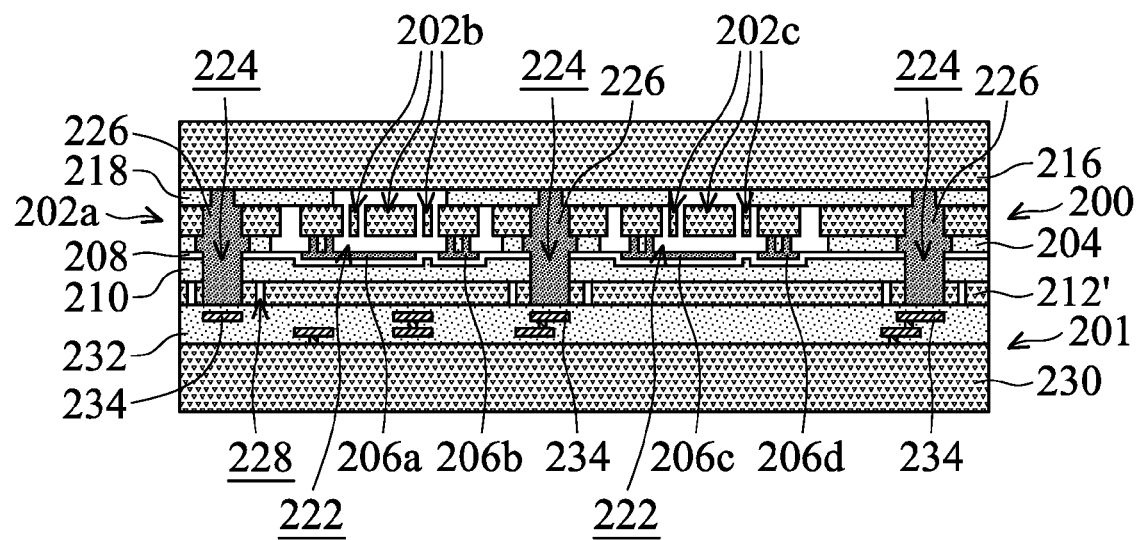
Figure 2M:
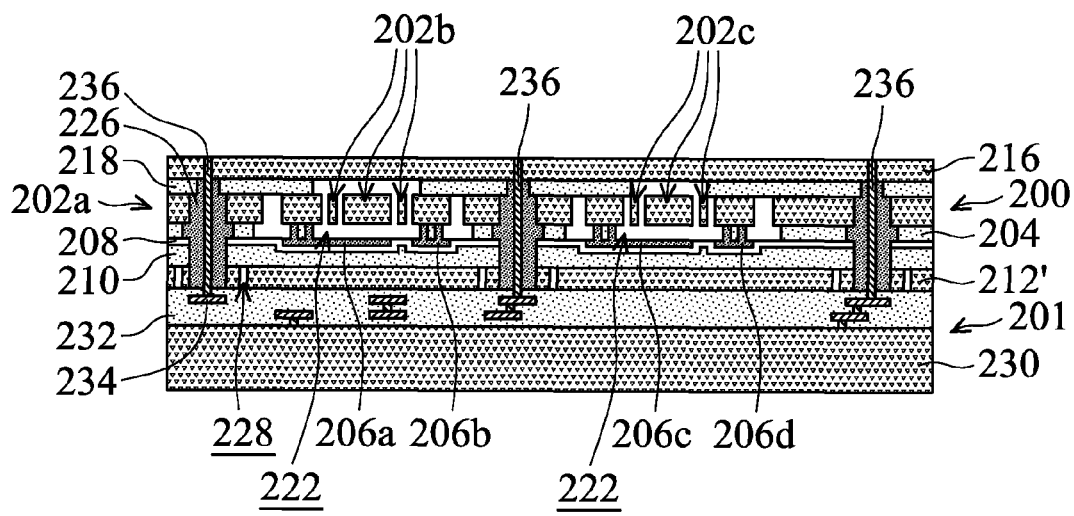
Figure 2N:
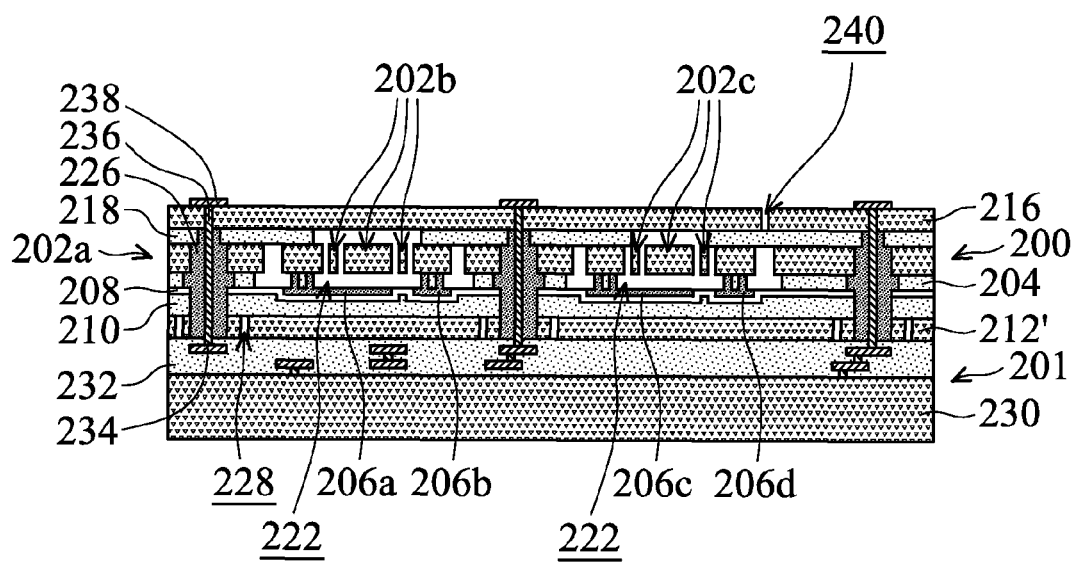
Figure 2O:
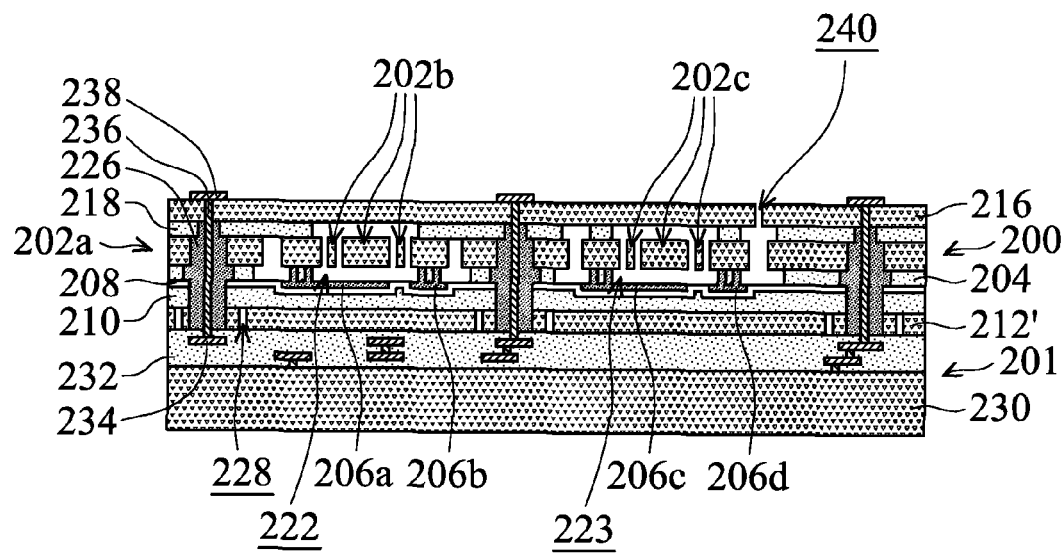
Figure 2P:
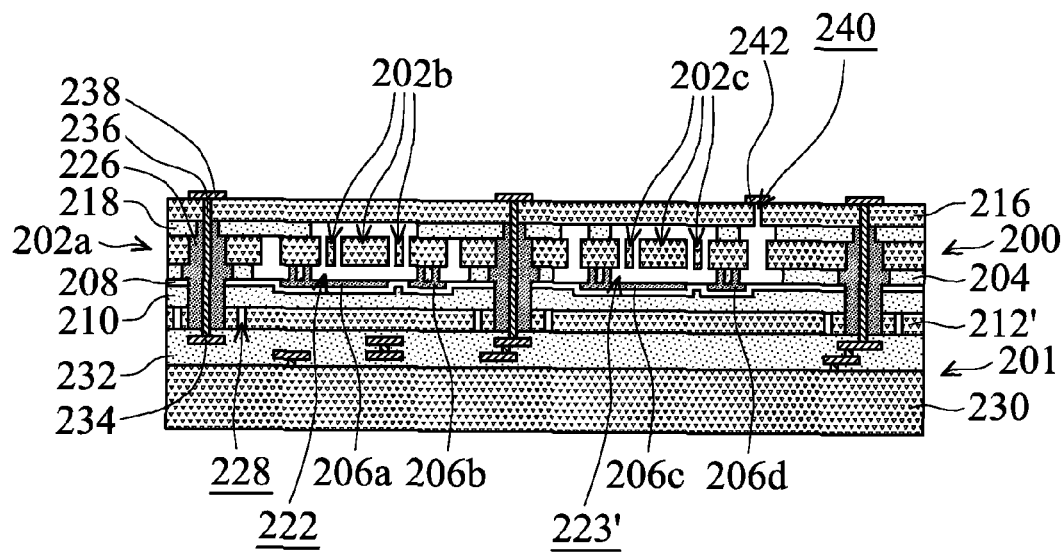
Figure 2Q:
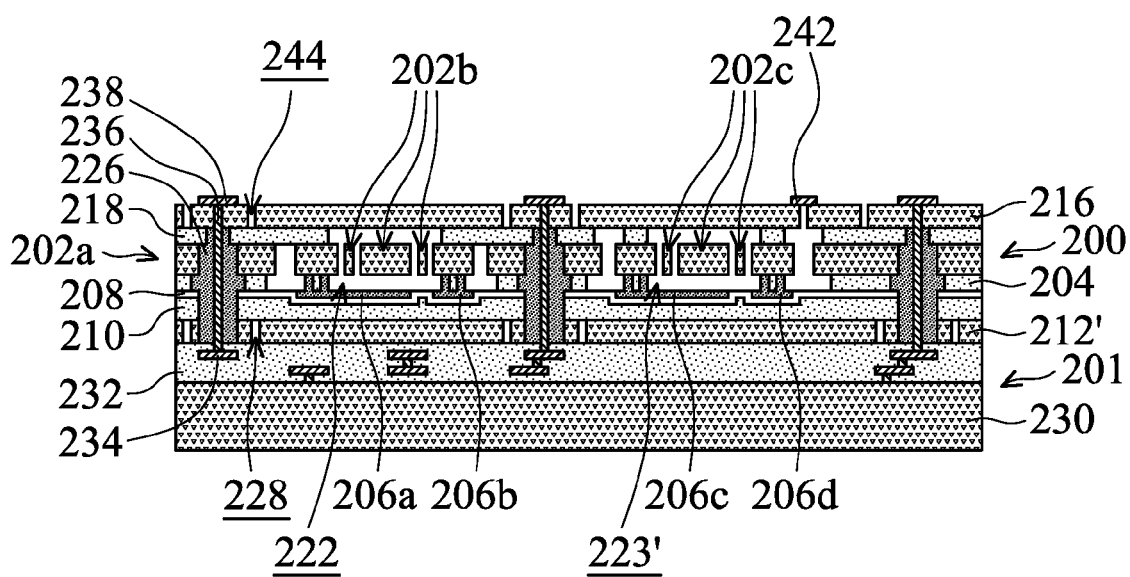
Figure 3A:
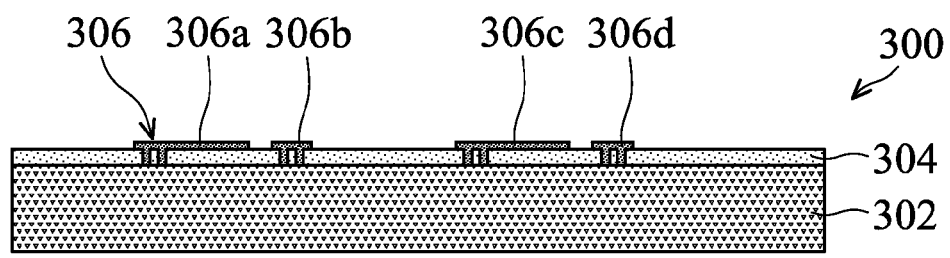
FIGS. 3A-3S are cross-sectional views of various stages of a process for forming a MEMS device, in accordance with some embodiments.
Figure 3B:
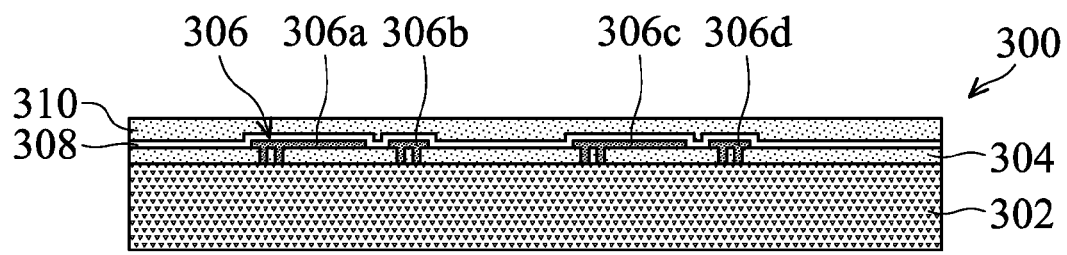
Figure 3C:
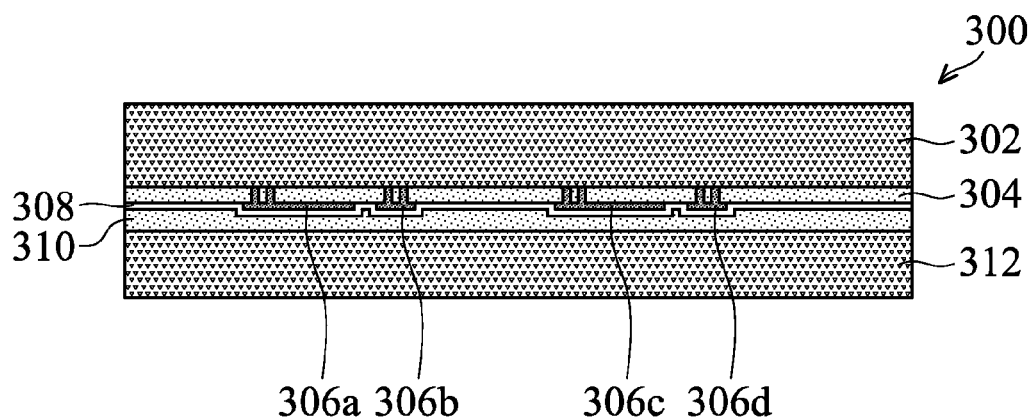
Figure 3D:
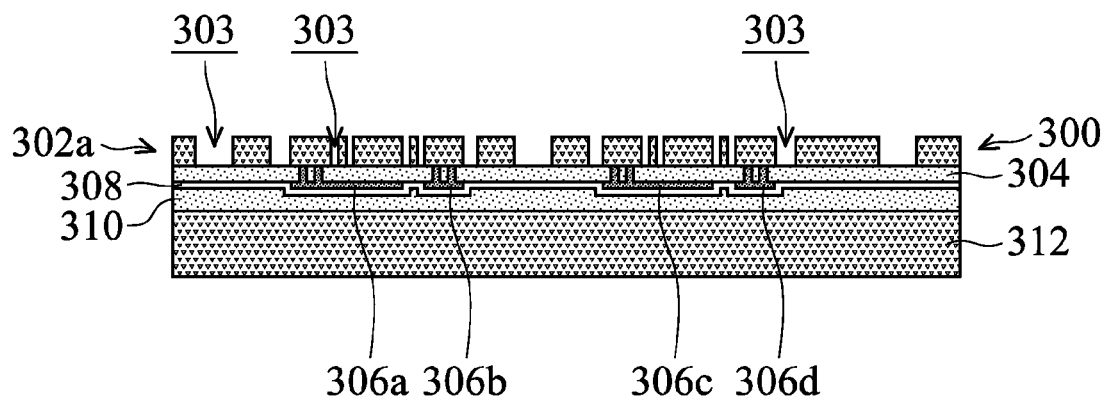
Figure 3E:
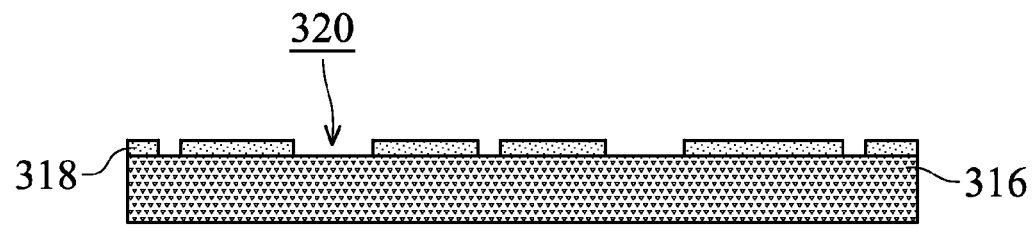
Figure 3F:
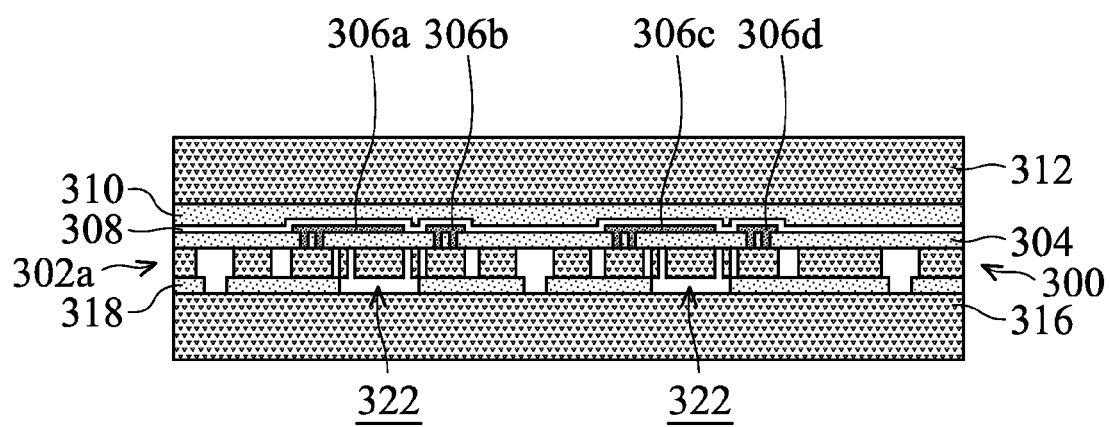
Figure 3G:
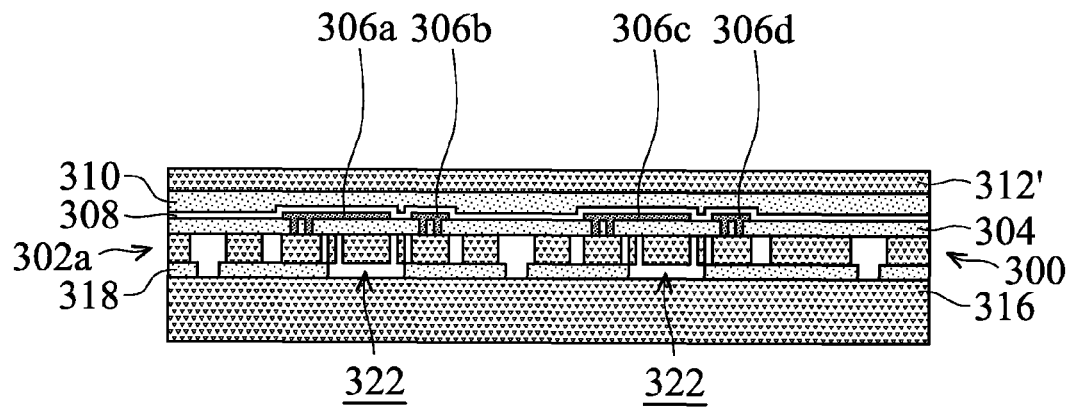
Figure 3H:
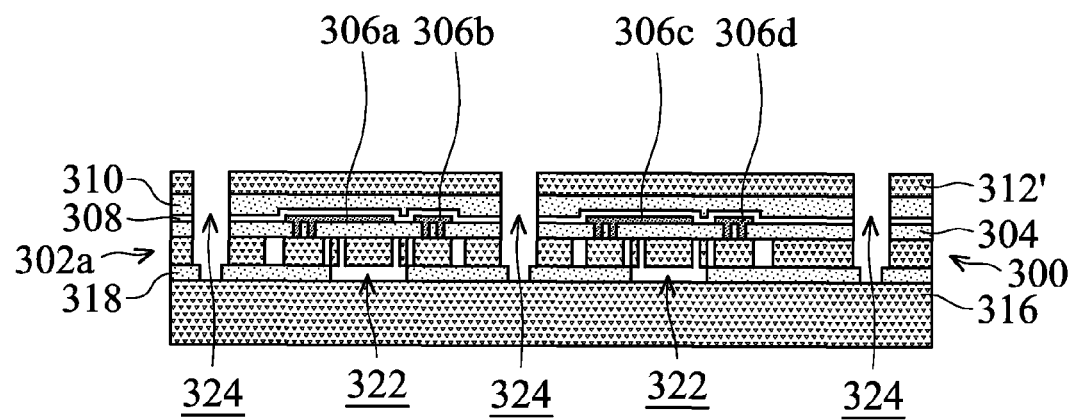
Figure 3I:
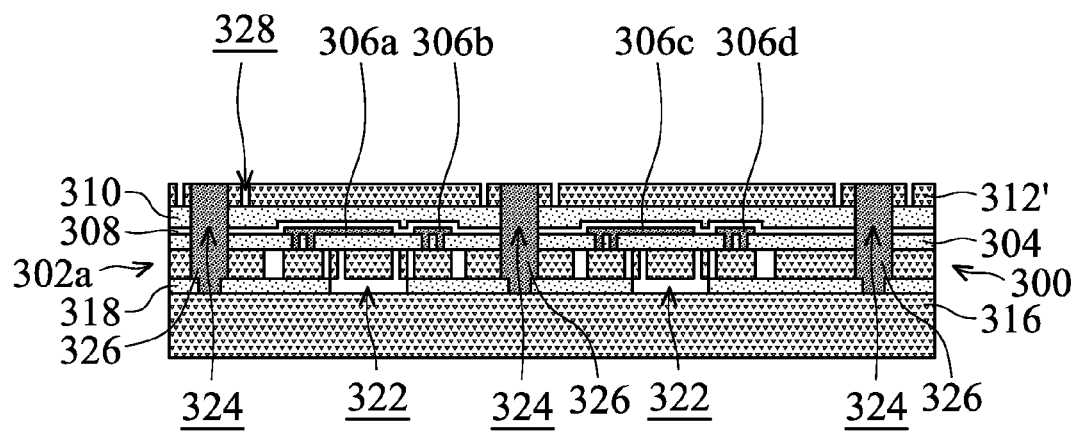
Figure 3J:
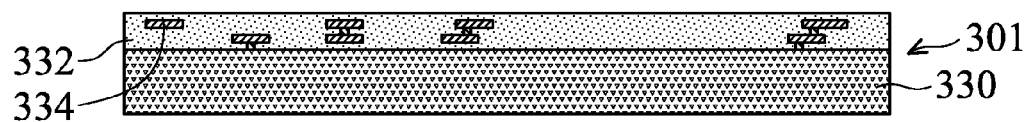
Figure 3K:
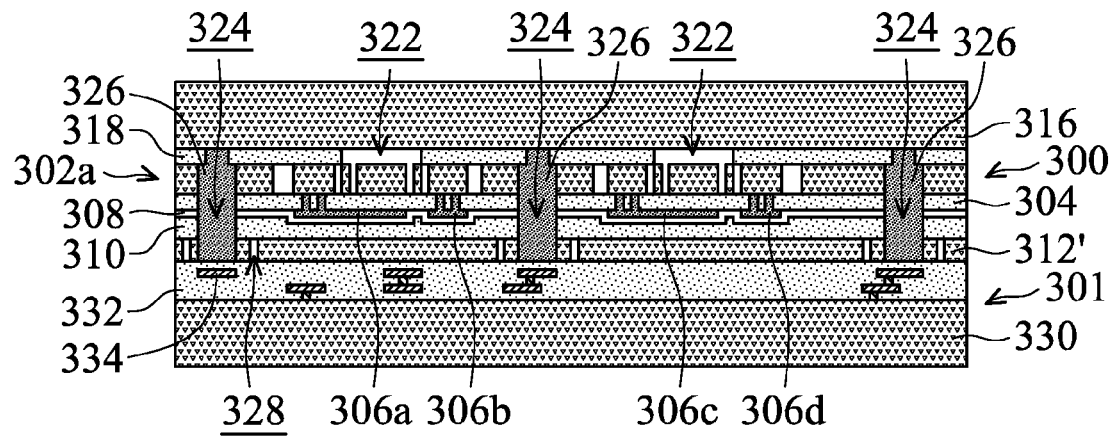
Figure 3L:
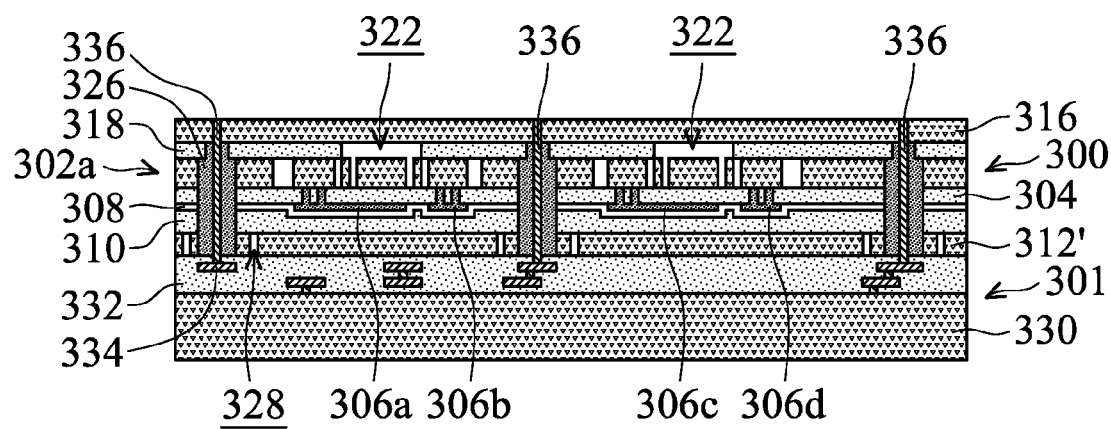
Figure 3M:
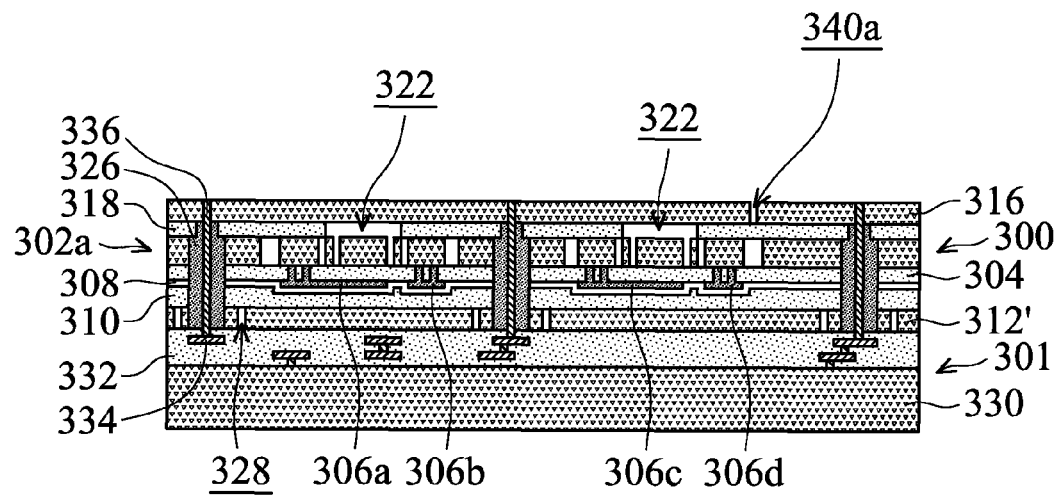
Figure 3N:
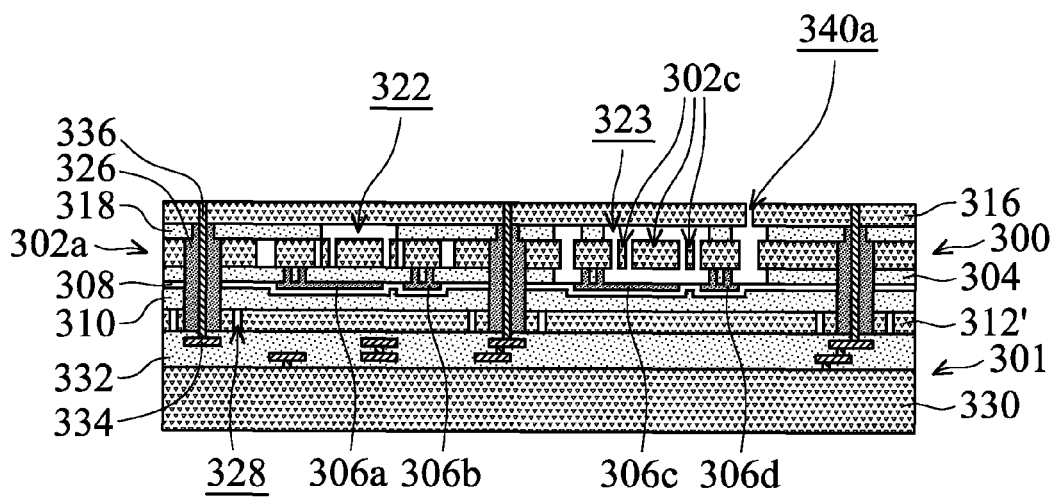
Figure 3O:
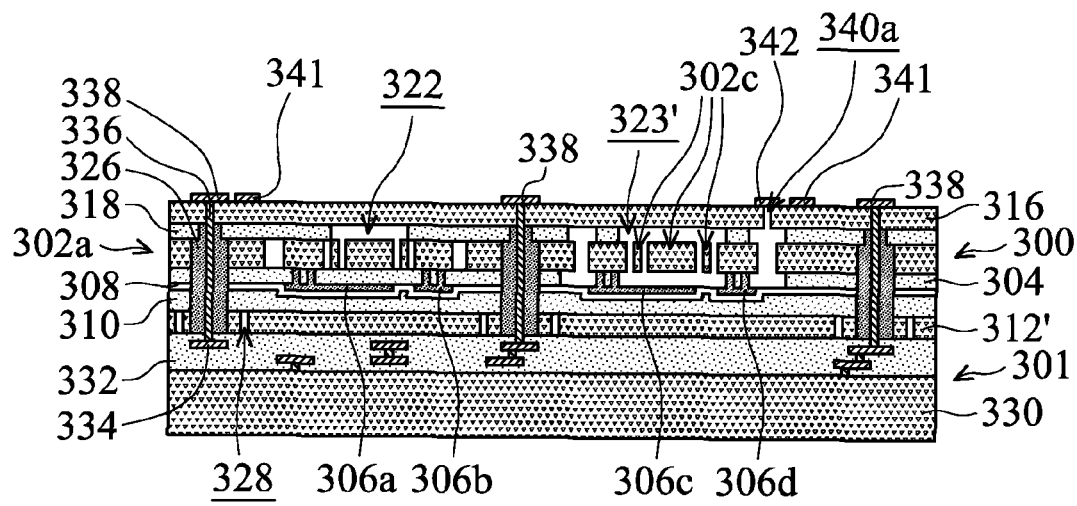
Figure 3P:
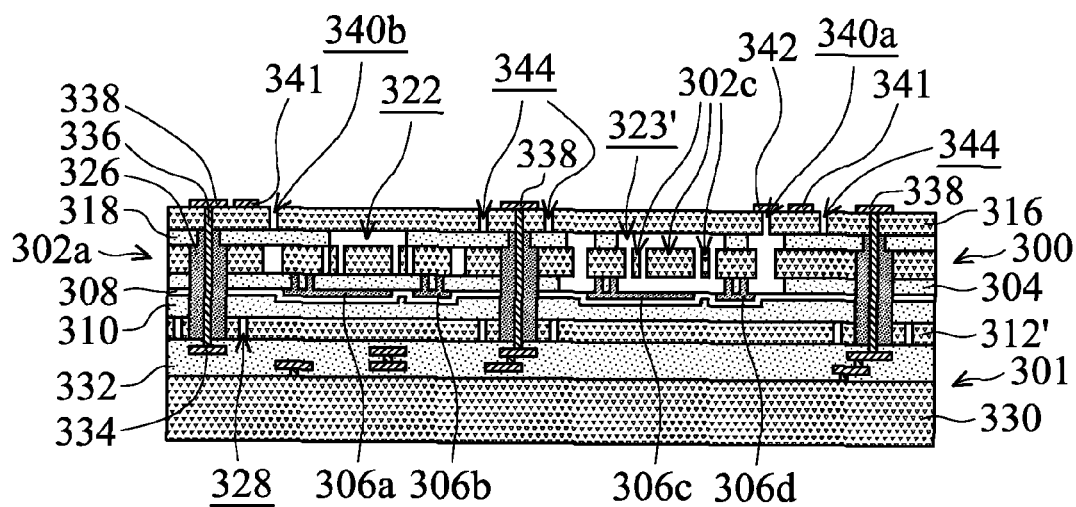
Figure 3Q:
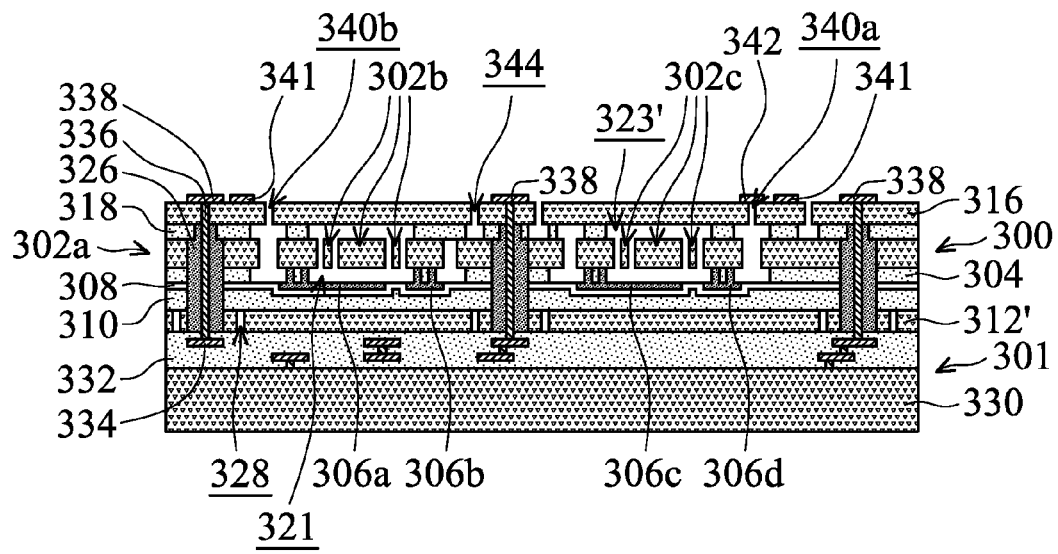
Figure 3R:
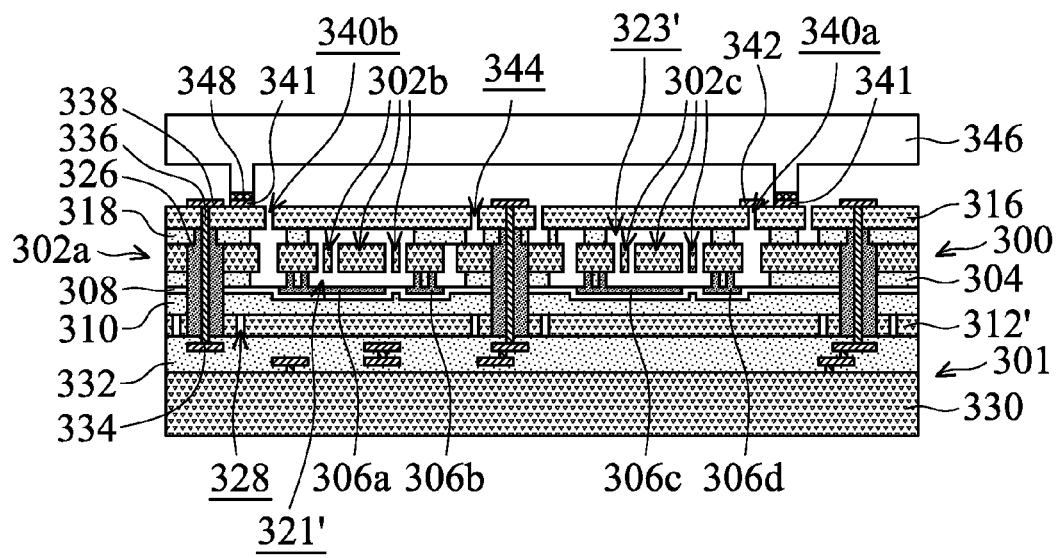
Figure 3S:
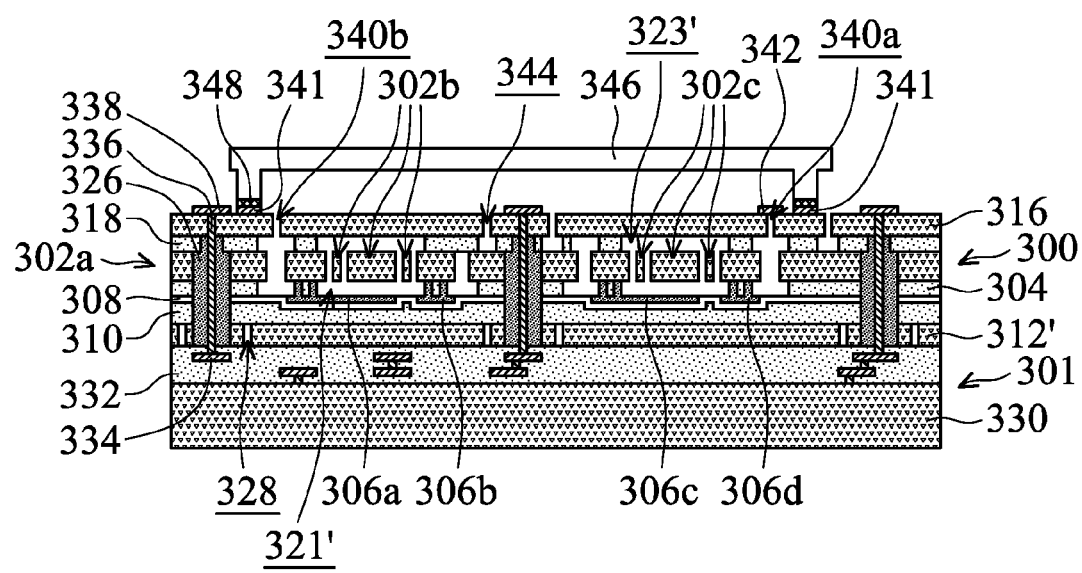
Figure 4A:
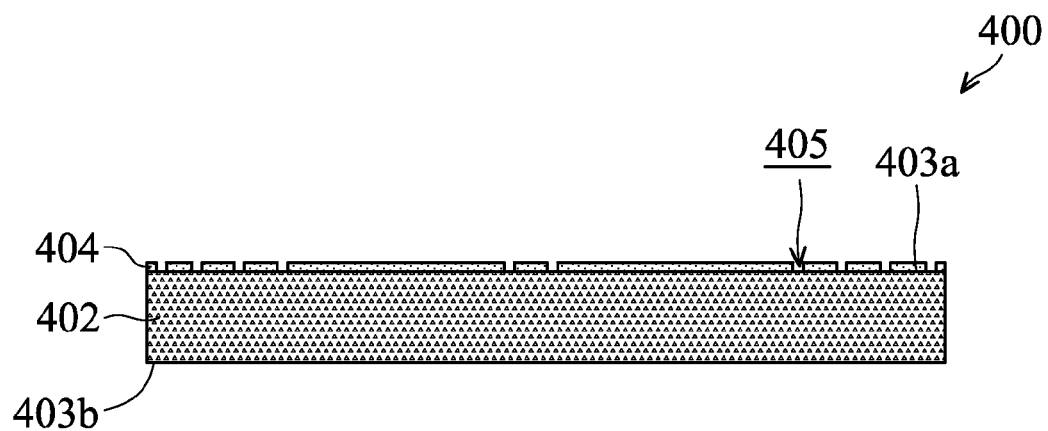
FIG. 4A-4N are cross-sectional views of various stages of a process for forming a MEMS device, in accordance with some embodiments.
Figure 4B:
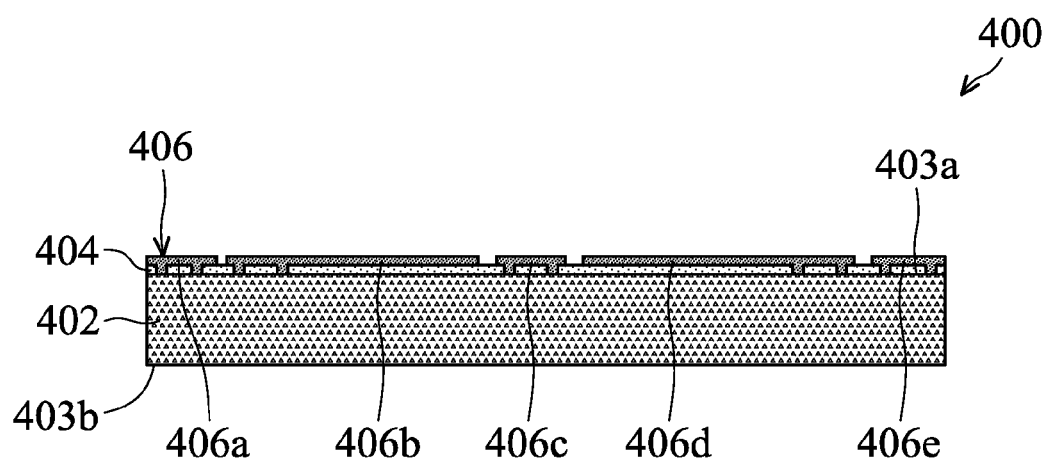
Figure 4C:
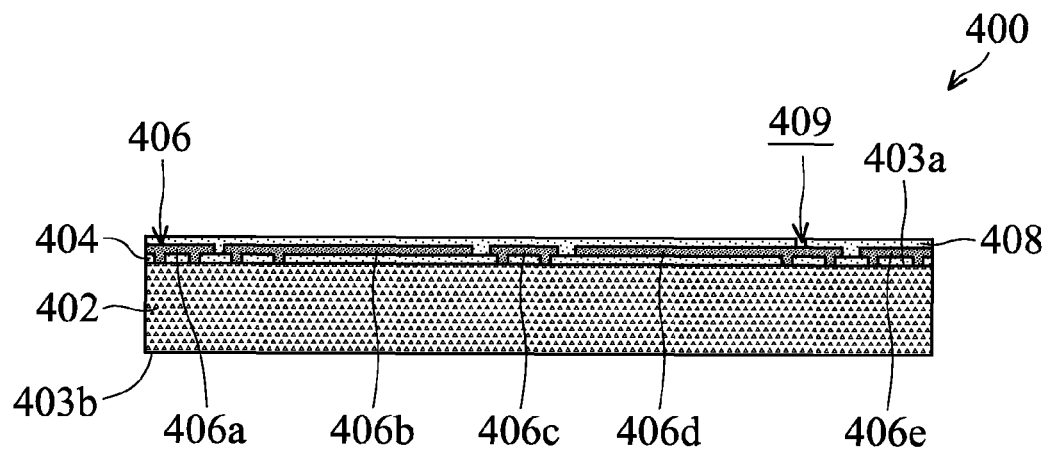
Figure 4D:
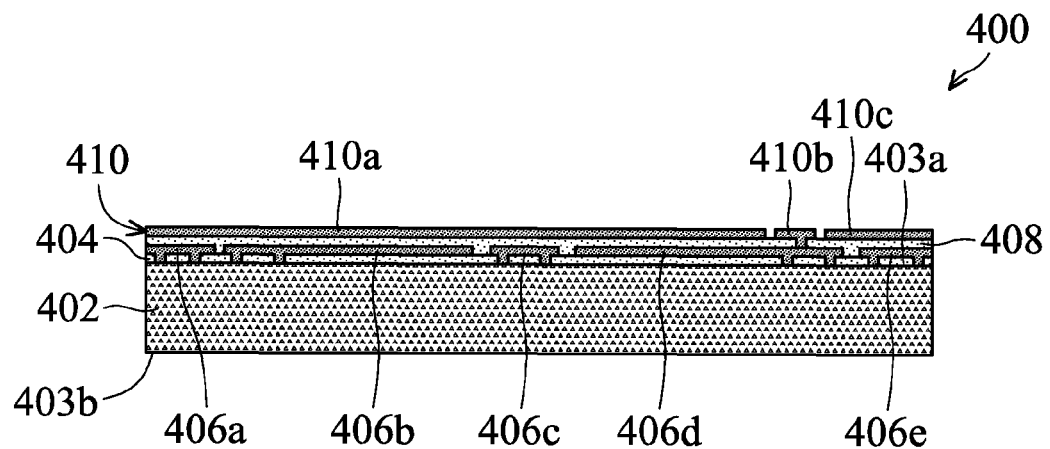
Figure 4E:
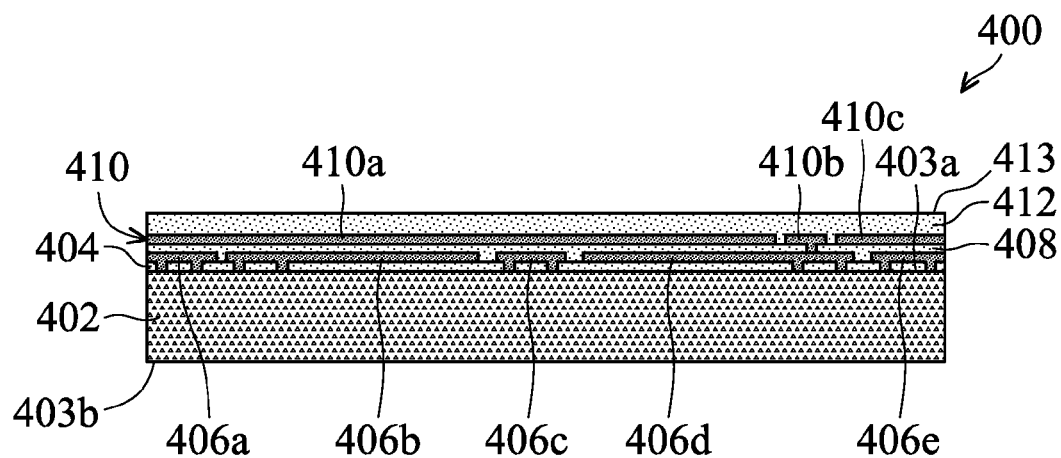
Figure 4F:
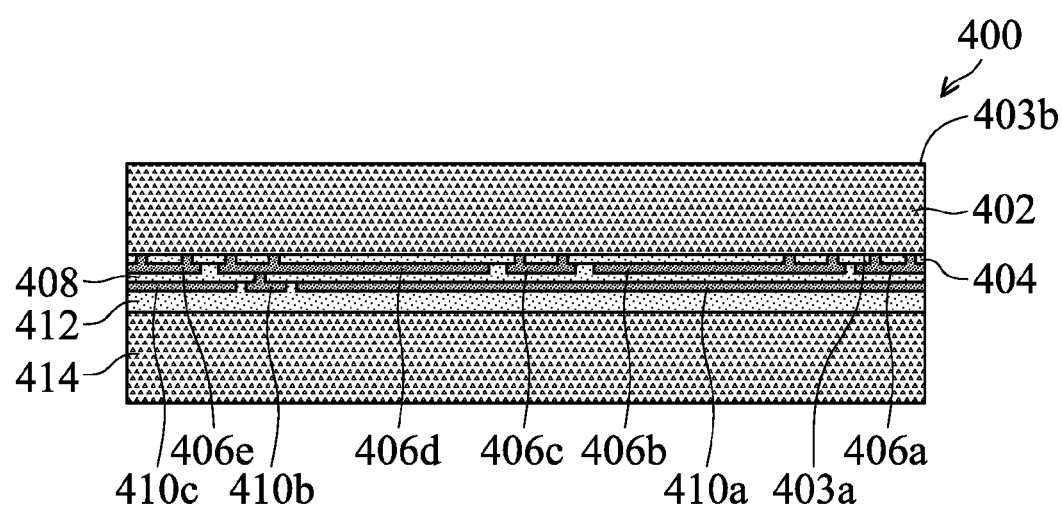
Figure 4G:
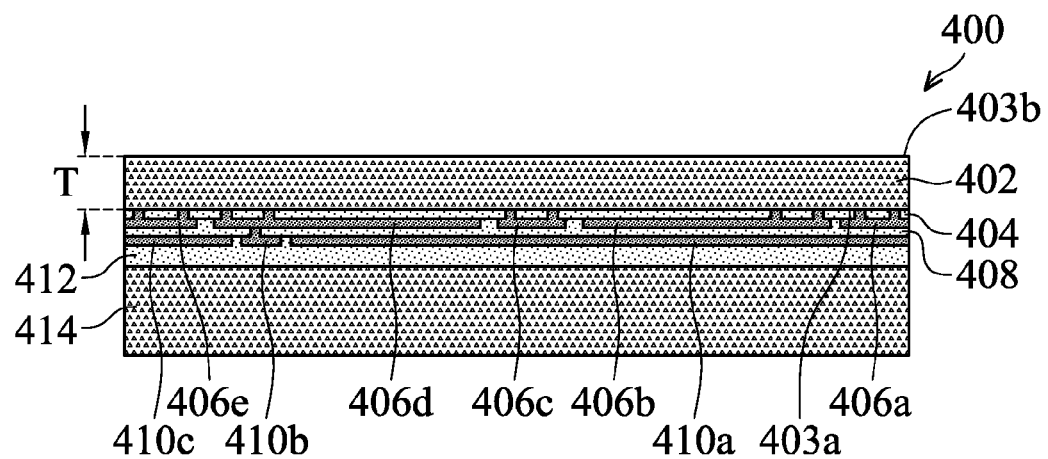
Figure 4H:
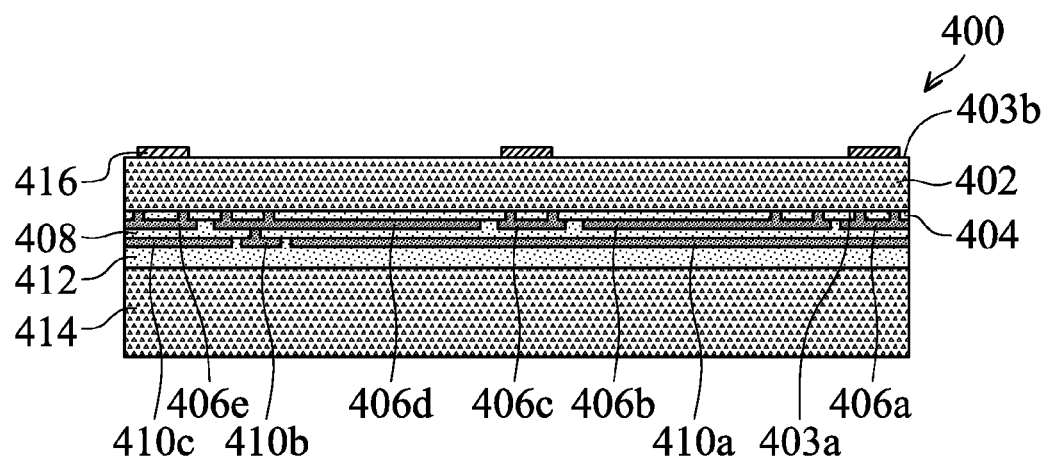
Figure 4I:
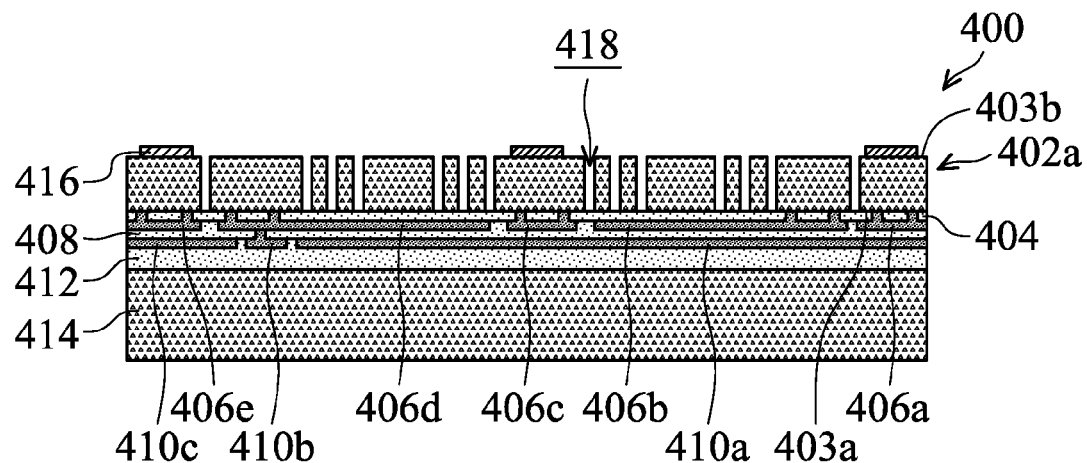
Figure 4J:
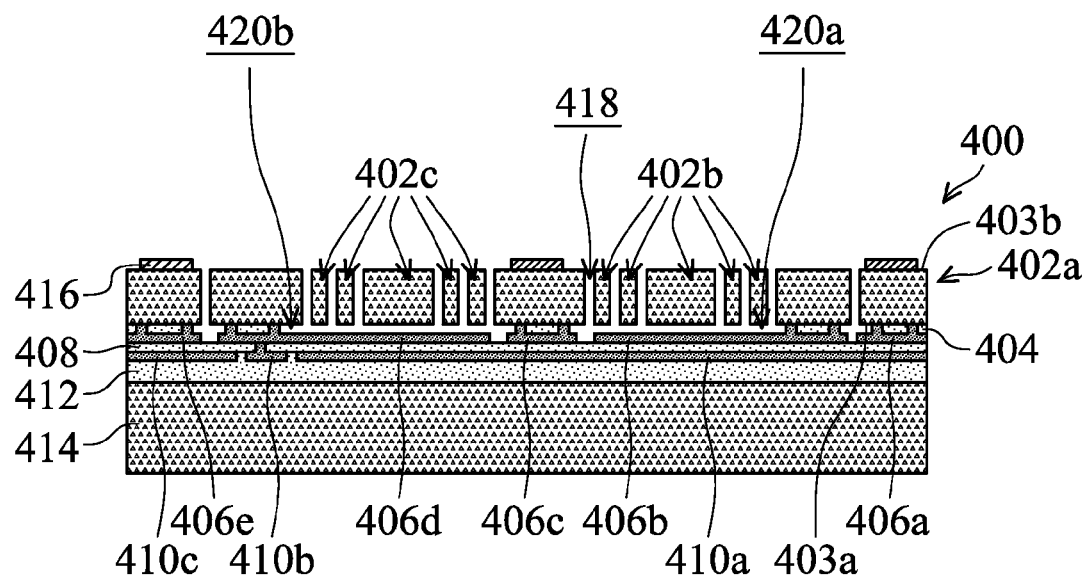
Figure 4K:
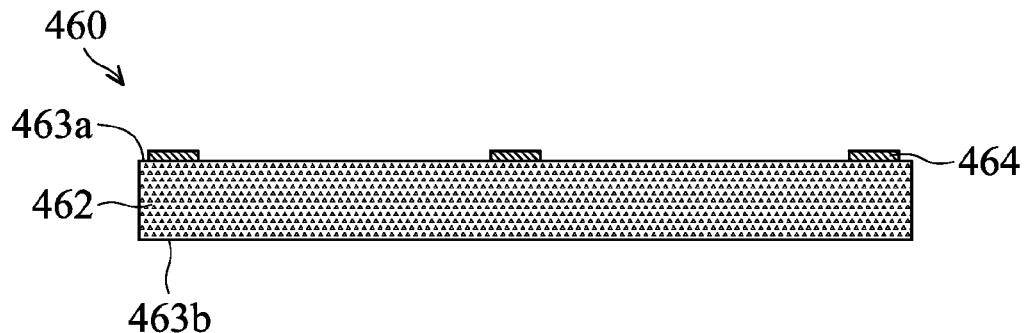
Figure 4L:
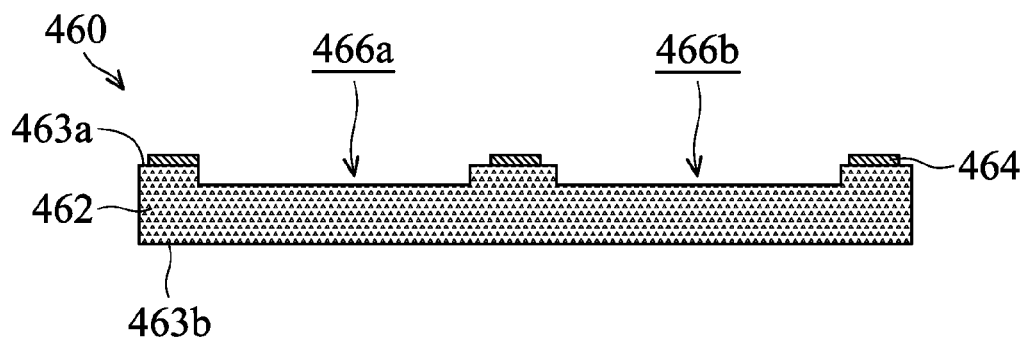
Figure 4M:
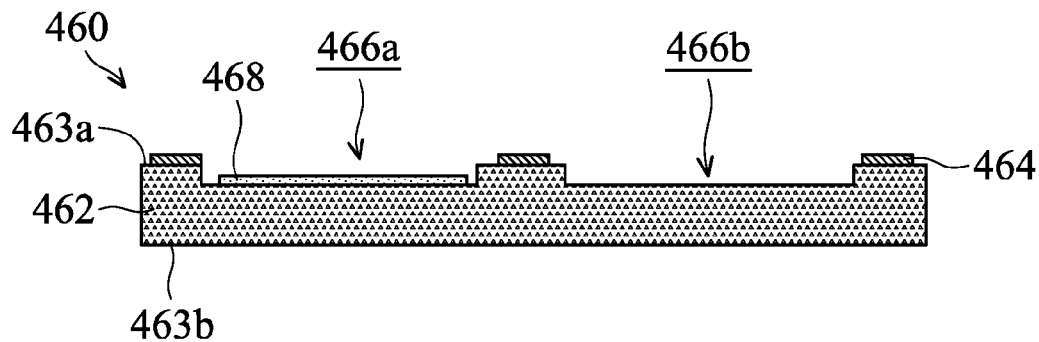
Figure 4N:
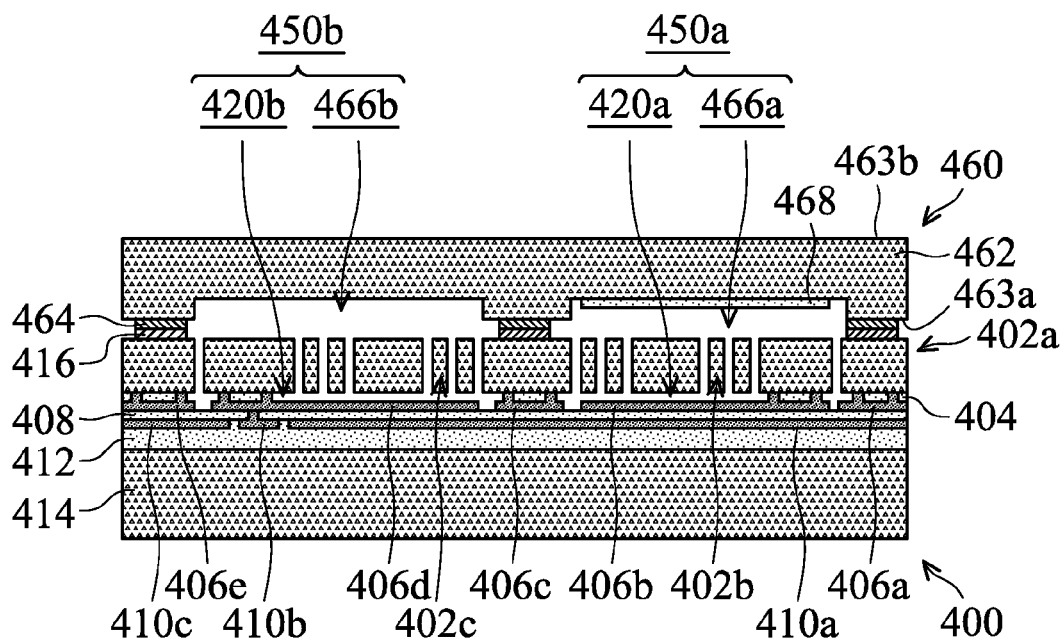
Figure 5A:
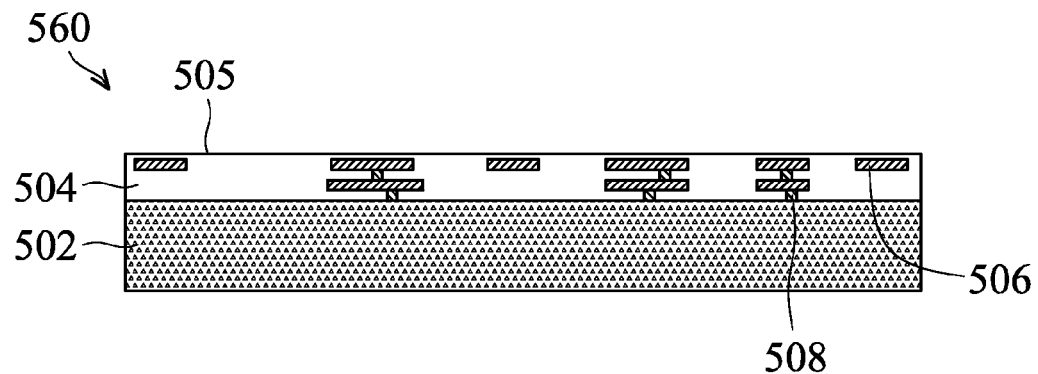
FIGS. 5A-5F are cross-sectional views of various stages of a process for forming a MEMS device, in accordance with some embodiments.
Figure 5B:
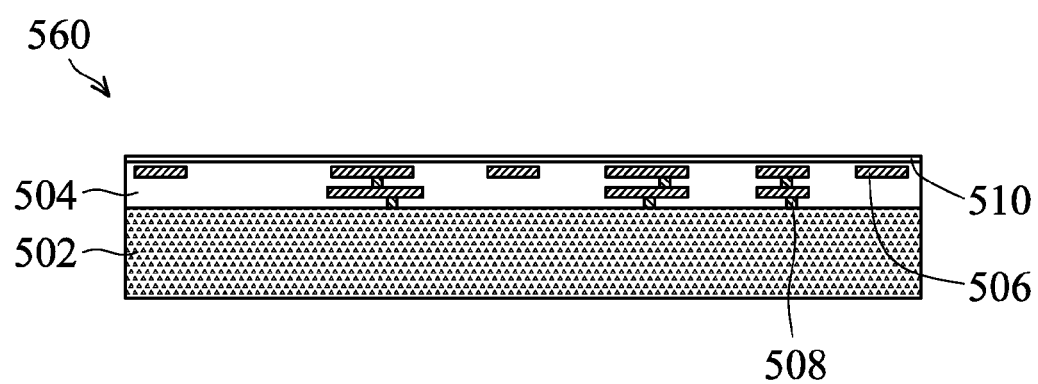
Figure 5C:
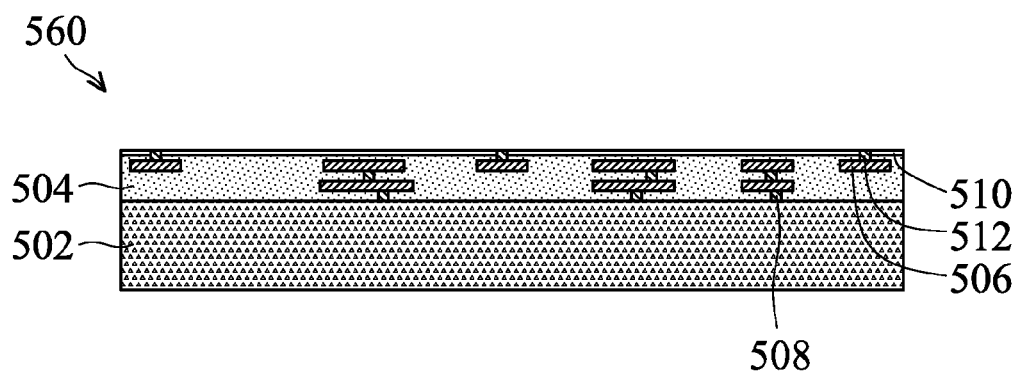
Figure 5D:
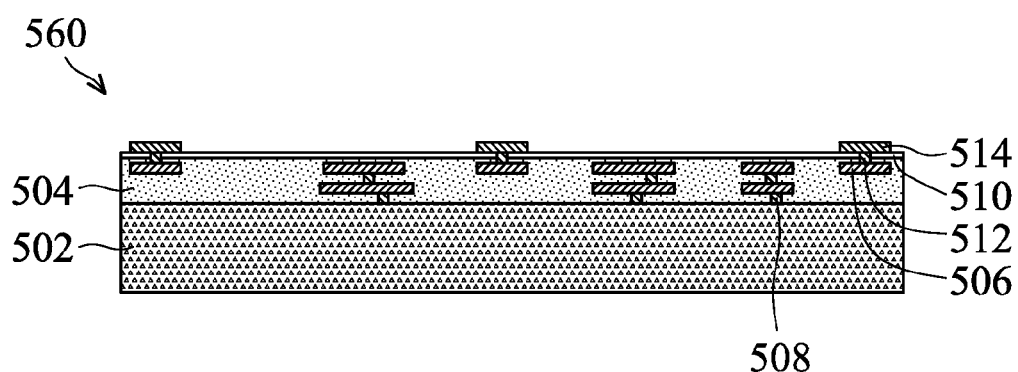
Figure 5E:
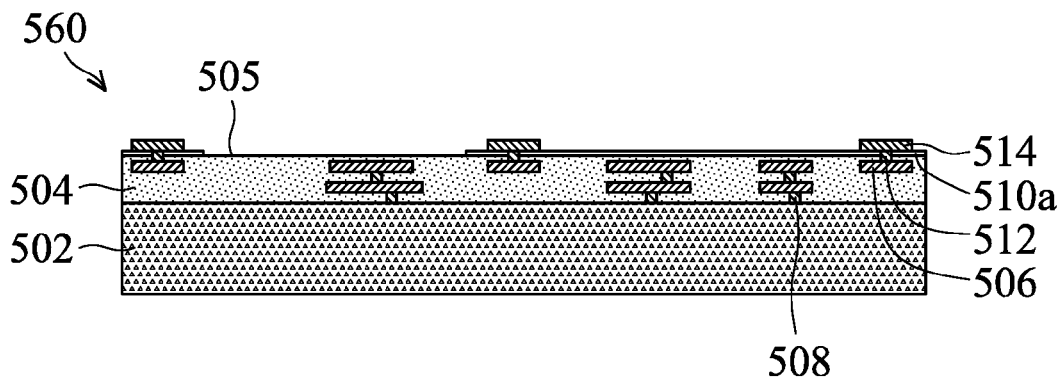
Figure 5F:
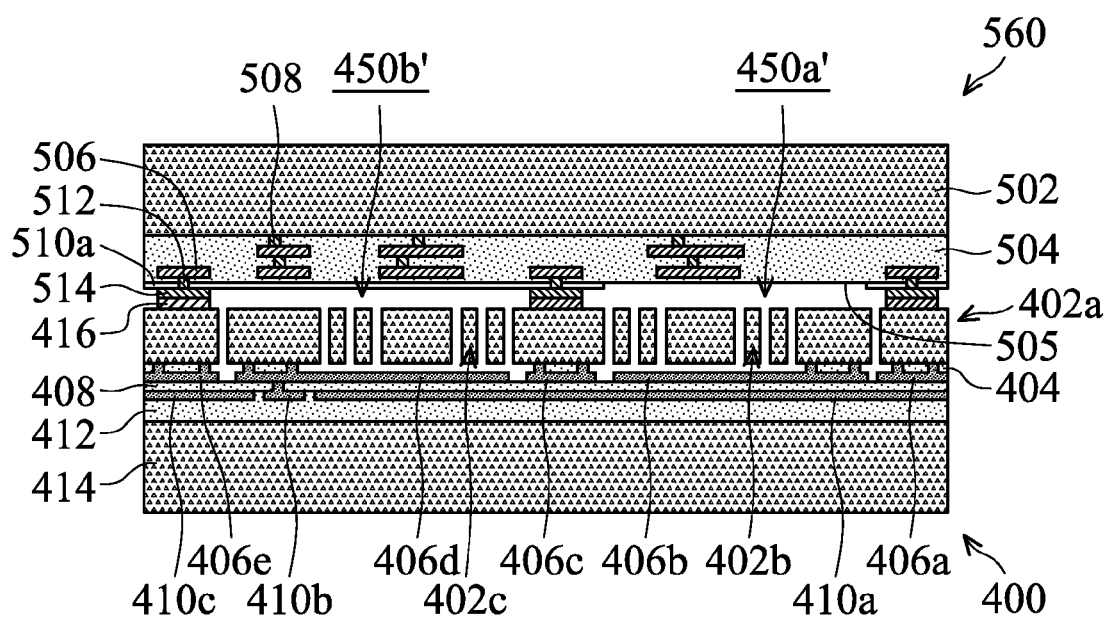
Figure 6:
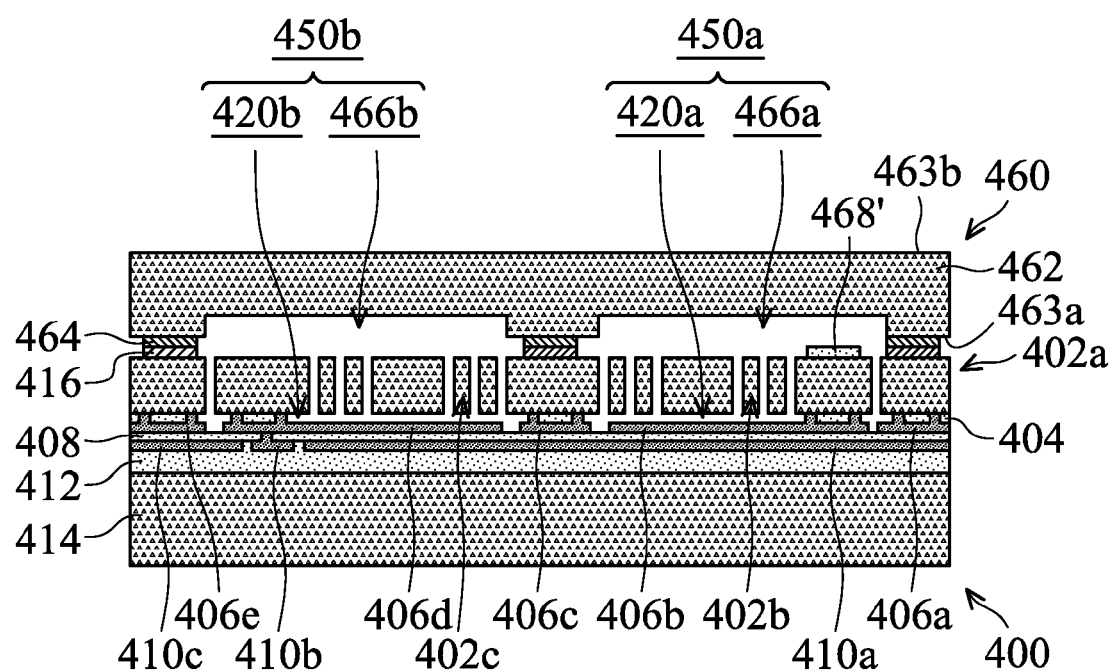
FIG. 6 is a cross-sectional view of a MEMS device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a micro-electro-mechanical system (MEMS) device. The embodiments of the disclosure may also be applied, however, to a variety of electrical or mechanical semiconductor devices. Hereinafter, various embodiments will be explained with reference to the accompanying drawings. Some variations of the embodiments are described.

Detailed descriptions of the embodiments illustrated in FIGS. 1-6 are described in U.S. patent application Ser. No. 14/084,161, filed Nov. 19, 2013 and U.S. patent application Ser. No. 14/276,295, filed May 13, 2014. Therefore, they are not illustrated repeatedly.

Figure 7A:
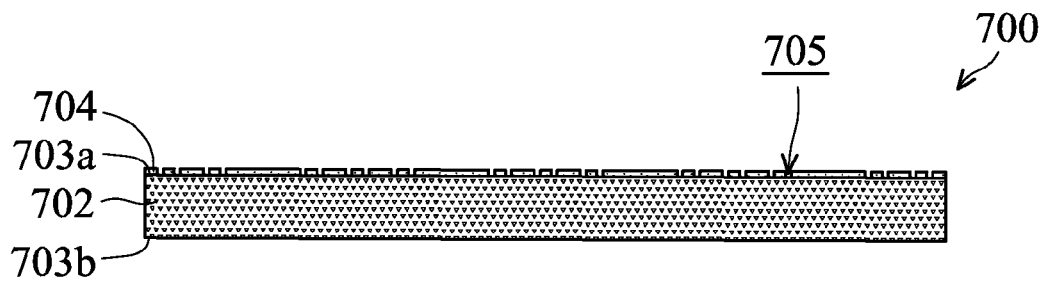
FIGS. 7A-7N are cross-sectional views of various stages of a process for forming a MEMS device, in accordance with some embodiments.

Many variations and modifications can be made to embodiments of the disclosure. FIGS. 7A-7N are cross-sectional views of various stages of a process for forming a MEMS device, in accordance with some embodiments. Among these figures, FIGS. 7A-7J shows various stages of a process for forming a MEMS substrate 700 of the MEMS device, in accordance with some embodiments.

As shown in FIG. 7A, a semiconductor substrate 702 is provided. The semiconductor substrate 702 has opposite surfaces 703a and 703b. The MEMS substrate 700 includes a semiconductor substrate 702. In some embodiments, the semiconductor substrate 702 includes a bulk semiconductor substrate such as a silicon wafer. The bulk semiconductor substrate may be made of silicon, germanium, silicon carbide, or the like. Alternatively, other substrates that may be used include multi-layered substrates, gradient substrates, hybrid orientation substrates, and/or the like. In some other embodiments, the semiconductor substrate 702 includes a semiconductor on insulator (SOI) substrate.

As shown in FIG. 7A, a dielectric layer 704 is deposited and patterned over the surface 703a of the semiconductor substrate 702, in accordance with some embodiments. In some embodiments, the dielectric layer 704 is made of silicon oxide, silicon nitride, silicon oxynitride, another suitable material, or a combination thereof. In some embodiments, the dielectric layer 704 is deposited using a CVD process, a thermal oxidation process, a spin-on process, another applicable process, or a combination thereof. Afterwards, the dielectric layer 704 is patterned to form one or more contact holes 705, as shown in FIG. 7A in accordance with some embodiments. In some embodiments, the contact holes 705 expose the semiconductor substrate 702. A photolithography process and an etching process may be used to form the contact holes 705. In some embodiments, the patterned dielectric layer 704 is annealed at a high temperature to induce outgassing of the dielectric layer 704. For example, the dielectric layer 704 is annealed at a temperature ranging from about 900 degrees C. to about 1200 degrees C. for about 2 hours. In some embodiments, the dielectric layer 704 is not annealed at this stage.

Figure 7B:
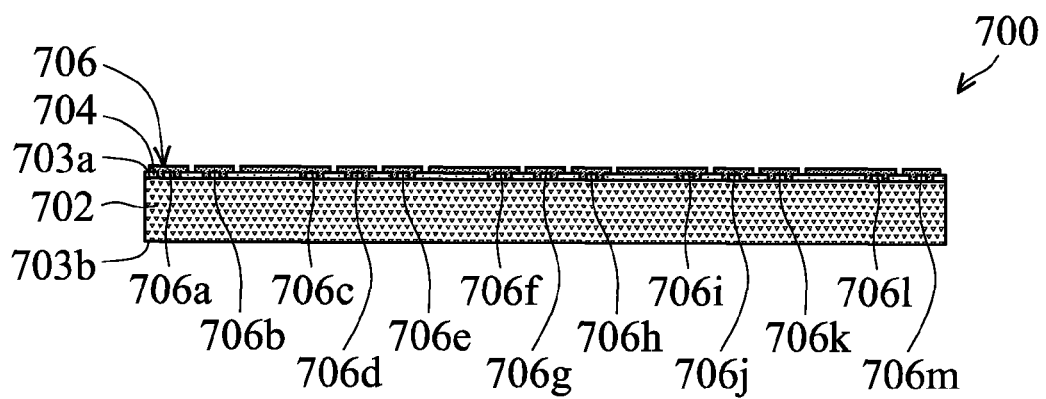

As shown in FIG. 7B, a conductive layer 706 is deposited and patterned over the dielectric layer 704 and the semiconductor substrate 702, in accordance with some embodiments. In some embodiments, the conductive layer 706 is made of a conductive material having a high melting point, such as higher than about 900 degrees C. In some embodiments, the conductive layer 706 has a melting point higher than about 1200 degrees C. In some embodiments, the conductive layer 706 is made of a semiconductor material, such as polysilicon. The conductive layer 706 may be deposited by using a CVD process, physical vapor deposition (PVD) process, or other applicable processes. The conductive layer 706 may be doped with n-type impurities or p-type impurities to have a suitable conductivity.

In some embodiments, the conductive layer 706 is patterned into multiple portions including portions 706a-706m, as shown in FIG. 7B. In some embodiments, a photolithography process and an etching process are used to pattern the conductive layer 706. Each of these portions may function as a contact element and/or an electrode element. Some of these portions may be electrically connected to each other. In some embodiments, some of these portions function as sensing electrodes and/or routing electrodes.

Figure 7C:
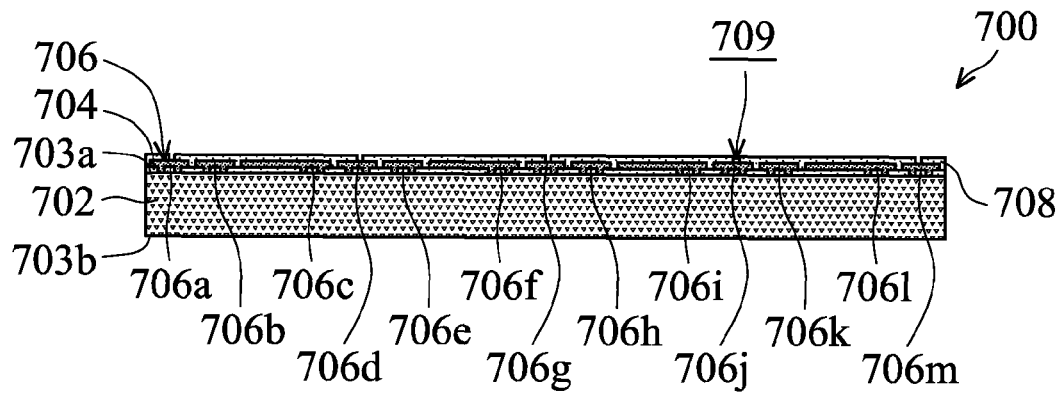

As shown in FIG. 7C, a dielectric layer 708 is deposited over the dielectric layer 704 and the conductive layer 706, in accordance with some embodiments. In some embodiments, the dielectric layer 708 is made of silicon oxide, silicon nitride, silicon oxynitride, another suitable material, or a combination thereof. In some embodiments, the dielectric layer 708 is deposited using a CVD process, a spin-on process, other applicable processes, or a combination thereof. In some embodiments, a planarization process is performed on the dielectric layer 708 to provide the dielectric layer 708 with a substantially planar top surface. The planarization process includes, for example, a CMP process.

Afterwards, the dielectric layer 708 is patterned to form one or more contact holes 709, as shown in FIG. 7C in accordance with some embodiments. In some embodiments, the dielectric layer 708 is annealed at a high temperature to induce outgassing of the dielectric layer 708. In some other embodiments, the dielectric layer 708 is not annealed at this stage.

Figure 7D:
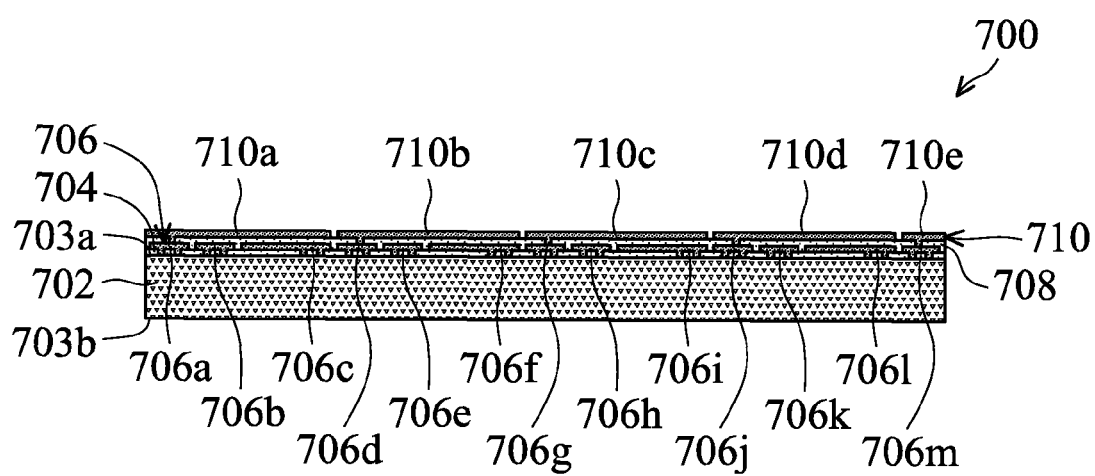

As shown in FIG. 7D, a conductive layer 710 is deposited and patterned over the dielectric layer 708 and the conductive layer 706, in accordance with some embodiments. In some embodiments, the materials and formation methods of the conductive layer 710 are similar to those of the conductive layer 706. The conductive layer 710 is patterned into multiple portions, such as portions 710a, 710b, 710c, 710d, and 710e, as shown in FIG. 7D. In some embodiments, some of these portions are used for electrical routing, electrical shielding, or the like. In some embodiments, through the contact holes 709 formed in the dielectric layer 708, the portions 710a, 710b, 710c, 710d, and 710e of the conductive layer 710 are electrically connected to the portions 706a, 706d, 706g, 706j and 706m of the conductive layer 706, respectively.

Figure 7E:
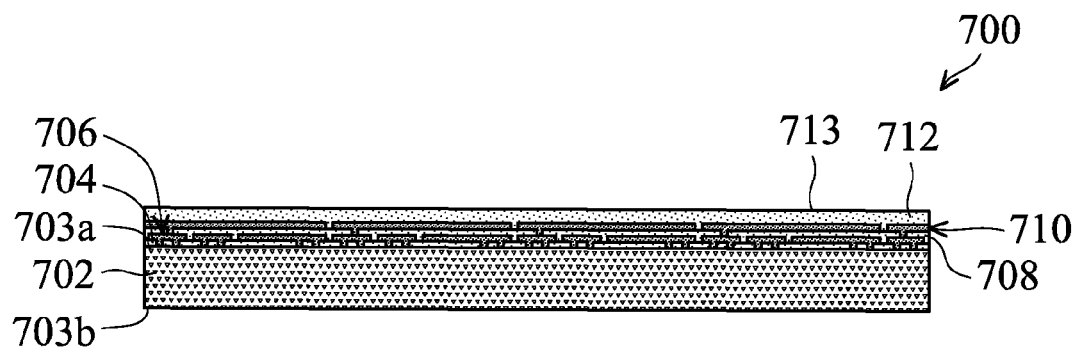

As shown in FIG. 7E, a dielectric layer 712 is deposited over the conductive layer 710 and the dielectric layer 708, in accordance with some embodiments. In some embodiments, the dielectric layer 712 is made of silicon oxide, silicon nitride, silicon oxynitride, other suitable materials, or a combination thereof. In some embodiments, the dielectric layer 712 is deposited using a CVD process, a spin-on process, other applicable processes, or a combination thereof. In some embodiments, the dielectric layer 712 is planarized to have a substantially planar top surface 713. The substantially planar top surface 713 facilitates a subsequent bonding process between the dielectric layer 712 and a carrier substrate. In some embodiments, the dielectric layer 712 is annealed at a high temperature to induce outgassing of the dielectric layer 712. For example, the dielectric layer 712 is annealed at a temperature ranging from about 900 degrees C. to about 1200 degrees C. for about 2 hours.

Figure 7F:
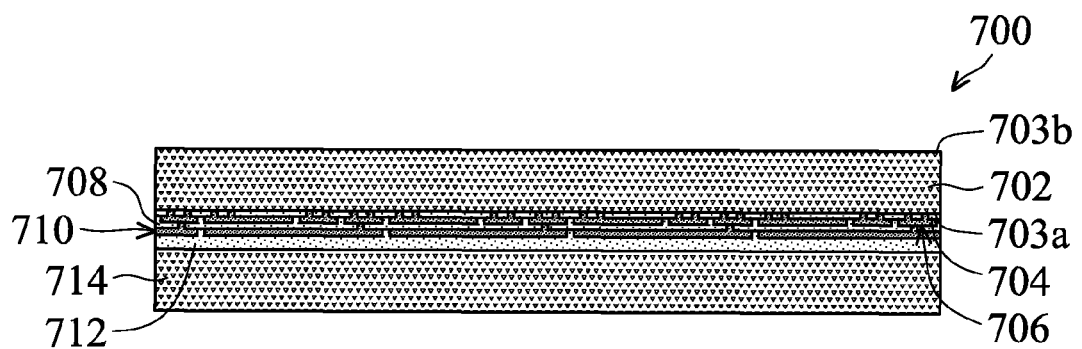

As shown in FIG. 7F, the structure shown in FIG. 7E is flipped upside down and bonded with a carrier substrate 714, in accordance with some embodiments. In some embodiments, the carrier substrate 714 is made of a semiconductor material, a metal material, a dielectric material, another suitable material, or a combination thereof. In some embodiments, the carrier substrate 714 is a semiconductor wafer, such as a silicon wafer. In some embodiments, the carrier substrate 714 is in direct contact with the dielectric layer 712. The bonding between the carrier substrate 714 and the dielectric layer 712 may be achieved by using a fusion bonding process, a eutectic bonding process, a plasma activated bonding process, a thermocompression bonding process, a diffusion bonding process, an anodic bonding process, another applicable process, or a combination thereof.

Figure 7G:
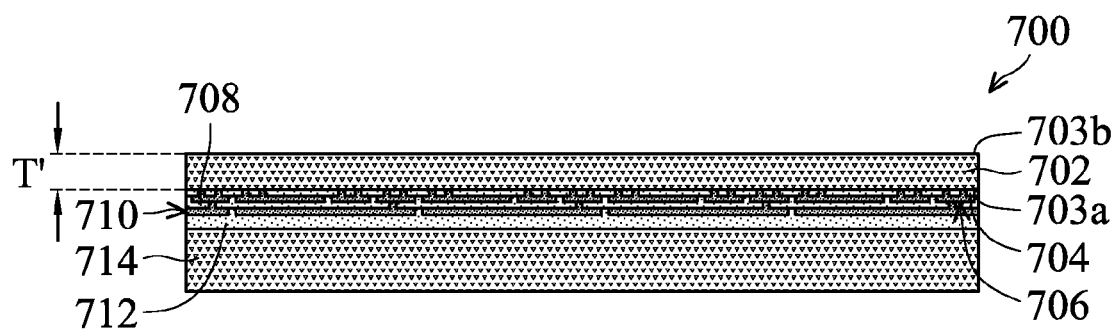

As shown in FIG. 7G, the semiconductor substrate 702 is thinned down from the surface 703b, in accordance with some embodiments. In some embodiments, a planarization process is performed to thin the semiconductor substrate 702 to a thickness T'. In some embodiments, the thickness T' is in a range from about 10 μm to about 60 μm. A suitable planarization process includes, for example, a CMP process, a mechanical grinding process, an etching process, other applicable processes, or a combination thereof. In some embodiments, the semiconductor substrate 702 is thinned using a grinding process, followed by a CMP process.

Figure 7H:
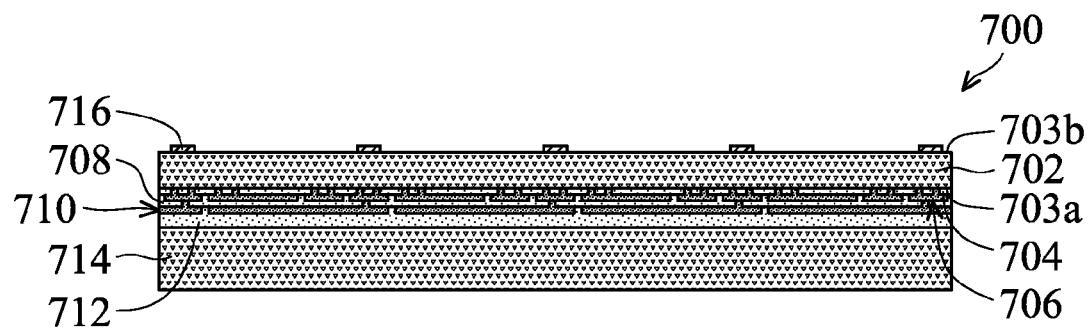

As shown in FIG. 7H, one or more bonding elements 716 are formed over the surface 703b of the semiconductor substrate 702, in accordance with some embodiments. In some embodiments, the bonding element 716 is made of a metal material, a semiconductor material, other suitable materials, or a combination thereof. A suitable metal material for forming the bonding element 716 includes, for example, aluminum (Al), copper (Cu), aluminum copper (AlCu), gold (Au), a similar material, or a combination thereof. A suitable semiconductor material for forming the bonding element 716 includes, for example, germanium. In some embodiments, a bonding material layer is deposited over the semiconductor substrate 702 using a PVD process, a plating process, a CVD process, other applicable processes, or a combination thereof. Afterwards, the bonding material layer is patterned to form the bonding elements 716, as shown in FIG. 7H.

Figure 7I:
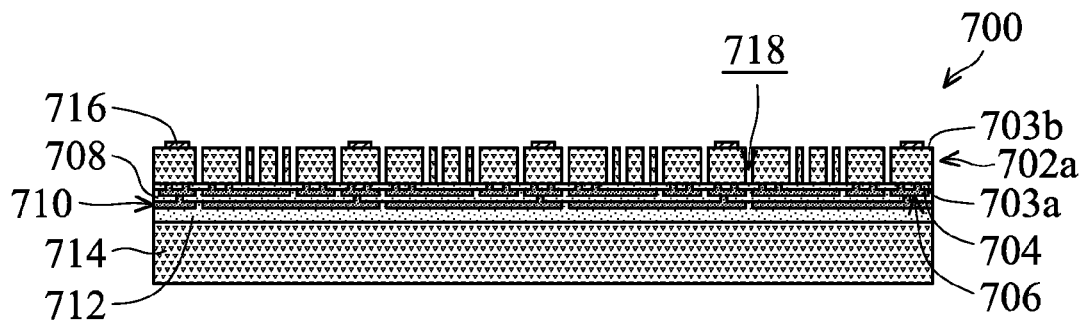

As shown in FIG. 7I, the semiconductor substrate 702 is patterned to form a number of elements 702a, in accordance with some embodiments. In some embodiments, the semiconductor substrate 702 is partially removed to form a number of openings 718. In some embodiments, the openings 718 expose the dielectric layer 704. For example, a photolithography process and an etching process are used to partially remove the semiconductor substrate 702. In some embodiments, some of the elements 702a connect with each other, and some of other elements do not.

Figure 7J:
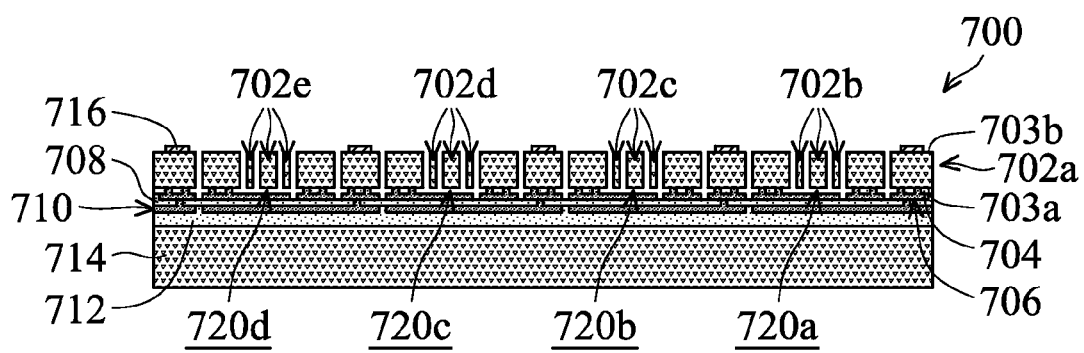

As shown in FIG. 7J, a portion of the dielectric layer 704 is removed through the openings 718 to form cavities including cavities 720a, 720b, 720c, and 720d, in accordance with some embodiments. For example, an etching process is used to partially remove the dielectric layer 704. In some embodiments, a portion of the dielectric layer 708 is also removed. After the cavities 720a, 720b, 720c, and 720d are formed, some of the elements 702a are released from the dielectric layer 704 and are free to move. In some embodiments, movable elements 702b, 702c, 702d, and 702e are formed, as shown in FIG. 7J. The movable elements 702b, 702c, 702d, and 702e are surrounded by the openings 718 and the cavities 720a, 720b, 720c, and 720d.

Figure 7K:
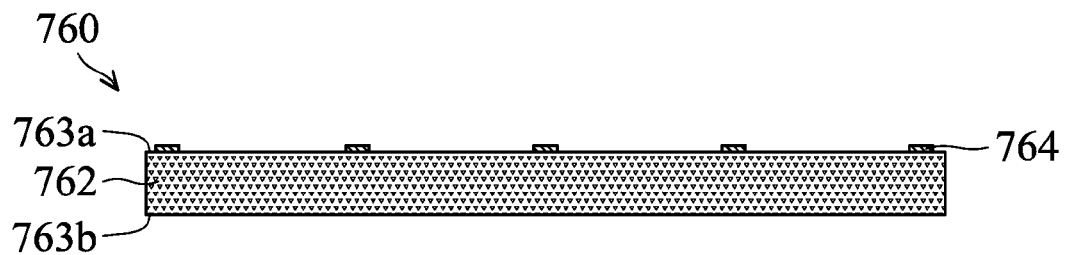
Figure 7L:
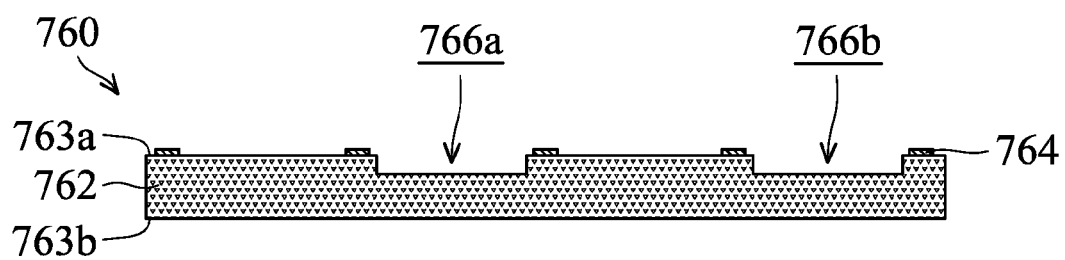
Figure 7M:
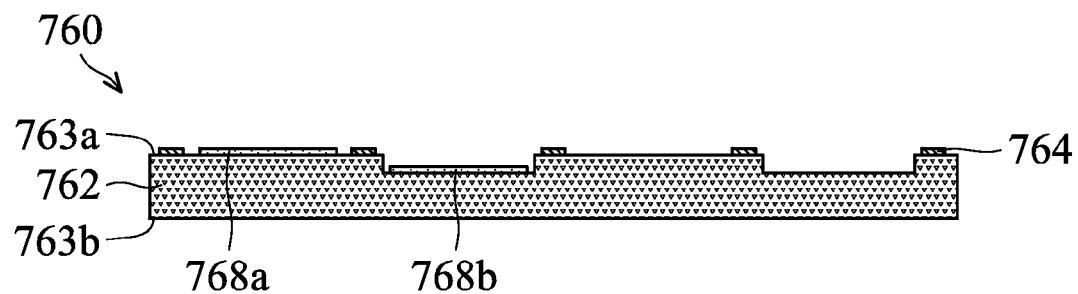
Figure 7N:
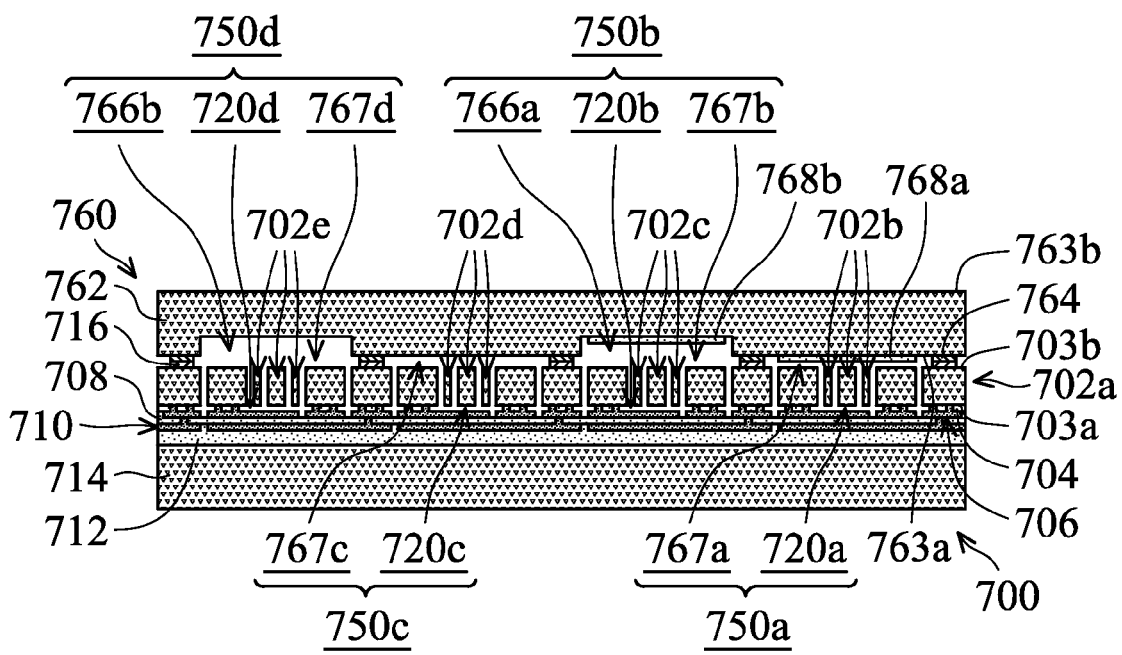

FIGS. 7K-7M are cross-sectional views of various stages of a process for forming a cap substrate 760 of the MEMS device, in accordance with some embodiments. As shown in FIG. 7K, a substrate 762 is provided. The substrate 762 has opposite surfaces 763a and 763b. In some embodiments, the substrate 762 is made of a semiconductor material, a dielectric material, a metal material, other suitable materials, or a combination thereof. In some embodiments, the substrate 762 is transparent. In some other embodiments, the substrate 762 is not transparent.

As shown in FIG. 7K, one or more bonding elements 764 are formed over the surface 763a of the substrate 762 of the cap substrate 760, in accordance with some embodiments. In some embodiments, the bonding element 764 is made of a semiconductor material, a metal material, other suitable materials, or a combination thereof. A suitable semiconductor material for forming the bonding element 764 includes, for example, germanium or the like. A suitable metal material for forming the bonding element 764 includes, for example, aluminum (Al), copper (Cu), aluminum copper (AlCu), gold (Au), the like, or a combination thereof. In some embodiments, a bonding material layer is deposited over the substrate 762 using a PVD process, a plating process, a CVD process, other applicable processes, or a combination thereof. Afterwards, the bonding material layer is patterned to form the bonding elements 764, as shown in FIG. 7K.

As shown in FIG. 7L, recesses 766a and 766b are formed in the substrate 762, in accordance with some embodiments. The substrate 762 is partially removed from the surface 763a to form the recesses 766a and 766b. For example, a photolithography process and an etching process are performed to partially remove the substrate 762.

As shown in FIG. 7M, pressure-changing layers 768a and 768b are formed over a portion of the surface 763a and a bottom of the recess 766a, in accordance with some embodiments. In some embodiments, the pressure-changing layers 768a and 768b are outgassing layers. In some embodiments, the pressure-changing layers 768a and 768b are in direct contact with the substrate 762. The pressure-changing layers 768a and 768b may release some gas slowly in a vacuumized space. The pressure-changing layers 768a and 768b may release gas which was previously trapped by the pressure-changing layers 768a and 768b or generated by the pressure-changing layers 768a and 768b.

In some embodiments, the pressure-changing layers 768a and 768b include a dielectric material. For example, the pressure-changing layers 768a and 768b are made of silicon oxide which is capable of releasing gas. In some other embodiments, the outgassing layer pressure-changing layers 768a and 768b are made of silicon oxynitride, other suitable materials, or a combination thereof. In some embodiments, the pressure-changing layers 768a and 768b are deposited at a temperature no higher than about 500 degrees C. For example, the pressure-changing layers 768a and 768b are deposited using a plasma enhanced chemical vapor deposition (PECVD) process. The deposition temperature may be in a range from about 200 degrees C. to about 500 degrees C. In some other embodiments, the pressure-changing layers 768a and 768b are deposited using a spin-on process or other applicable processes. In some embodiments, an outgassing material layer is deposited and patterned to form the pressure-changing layers 768a and 768b. In some embodiments, there is substantially no outgassing material layer left in the recess 766b.

As shown in FIG. 7N, the cap substrate 760 is bonded with the MEMS substrate 700 to form enclosed spaces 750a, 750b, 750c, and 750d, in accordance with some embodiments. The enclosed spaces may also be referred to as closed chambers. The enclosed space 750a includes the cavity 720a and a space 767a surrounded by the cap substrate 760, the MEMS substrate 700, and the bonding elements 716 and 764. Similarly, the enclosed space 750c includes the cavity 720c and a space 767c. The enclosed space 750b includes the cavity 720b, the recess 766a, a space 767b surrounded by the cap substrate 760, the MEMS substrate 700, and the bonding elements 716 and 764. Similarly, the enclosed space 750d includes the cavity 720d, the recess 766b, a space 767d. In some embodiments, two or more of the enclosed spaces 750a, 750b, 750c, and 750d have different volumes. For example, the enclosed space 750b (or 750d) is larger than the enclosed space 750a (or 750c).

In some embodiments, the cap substrate 760 is bonded with the MEMS substrate 700 through the bonding elements 716 and 764. In some embodiments, the cap substrate 760 and the MEMS substrate 700 are bonded together by using a eutectic bonding process, a plasma activated bonding process, a thermocompression bonding process, a diffusion bonding process, an anodic bonding process, other applicable processes, or a combination thereof. In some embodiments, the bonding element 716 is made of a metal material, such as aluminum copper, and the bonding element 764 is made of a semiconductor material, such as germanium. In some other embodiments, both of the bonding elements 716 and 764 are made of a metal material, such as gold.

In some embodiments, the bonding process for bonding the MEMS substrate 700 and the cap substrate 760 is performed in a process chamber of a bonding tool. The process chamber is vacuumized to a predetermined pressure. As a result, the pressures of the enclosed spaces 750a, 750b, 750c, and 750d are substantially the same as the predetermined pressure in the process chamber. In some embodiments, the pressure in each of the enclosed spaces is in a range from about 0.01 torr to about 10 torrs.

As shown in FIG. 7N, each of the enclosed spaces is surrounded by a gas-blocking structure including the substrate 762, the bonding elements 716 and 764, the conductive layer 706, and the dielectric layer 708 which has been annealed at a high temperature. Therefore, the pressures of the enclosed spaces 750a, 750b, 750c, and 750d are substantially unaffected by the environment outside of the enclosed spaces 750a, 750b, 750c, and 750d.

As mentioned above, the pressure-changing layers 768a and 768b in the enclosed space 750a and 750b could release some gas. As a result, the pressures of the enclosed spaces 750a and 750b are changed. In some embodiments, the pressures of the enclosed spaces 750a and 750b are increased due to the outgassing of the pressure-changing layers 768a and 768b. In some embodiments, the increased pressure in the enclosed space 750a (or 750b) is in a range from about 50 torrs to about 760 torrs. In some embodiments, the pressure-changing layers 768a and 768b are heated to induce the outgassing. In some embodiments, the pressure-changing layers 768a and 768b release some gas at a room temperature without being heated further. In some embodiments, the pressure in the enclosed space 750a is higher than that in the enclosed space 750b since the enclosed space 750a is smaller than the enclosed space 750b.

In some embodiments, each of the enclosed spaces 750c and 750d has a pressure lower than that of the enclosed space 750a or 750b. In some embodiments, the pressure in the enclosed space 750c is higher than that in the enclosed space 750d. After the bonding process, the pressures of the enclosed spaces 750c and 750d are initially the same. Afterwards, a slight amount of gas trapped in the materials surrounding the enclosed spaces 750c and 750d may be released. Because the enclosed space 750d is larger than the enclosed space 750c. As a result, the pressure in the enclosed space 750c is higher than that in the enclosed space 750d after the trapped gas is released. However, embodiments of the disclosure are not limited thereto. In some other embodiments, the pressures of the enclosed spaces 750c and 750d are substantially the same.

In some embodiments, the movable elements 702b and/or 702c in the enclosed space 750a and/or 750b are used for accelerometer applications. In some embodiments, the movable elements 702d and/or 702e in the enclosed space 750c and/or 750d are used for gyro applications and/or resonator applications.

Many variations and modifications can be made to embodiments of the disclosure. In some embodiments, the pressure-changing layer is a gas getter layer which is capable of absorbing gas. In some other embodiments, two or more kinds of pressure-changing layers are formed in the MEMS device. For example, both the gas getter layer and the outgassing layer are used.

Figure 8A:
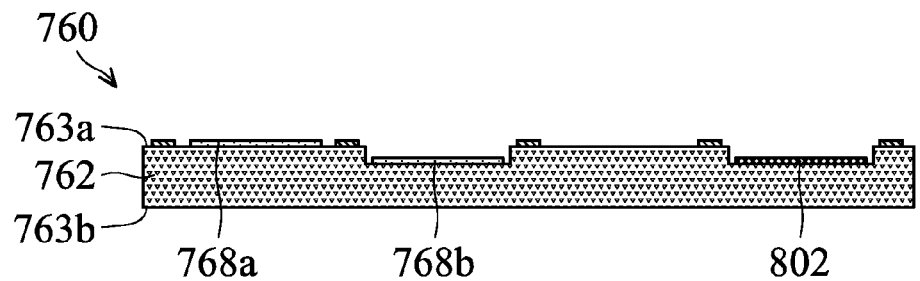
FIGS. 8A-8B are cross-sectional views of various stages of a process for forming a MEMS device, in accordance with some embodiments.
Figure 8B:
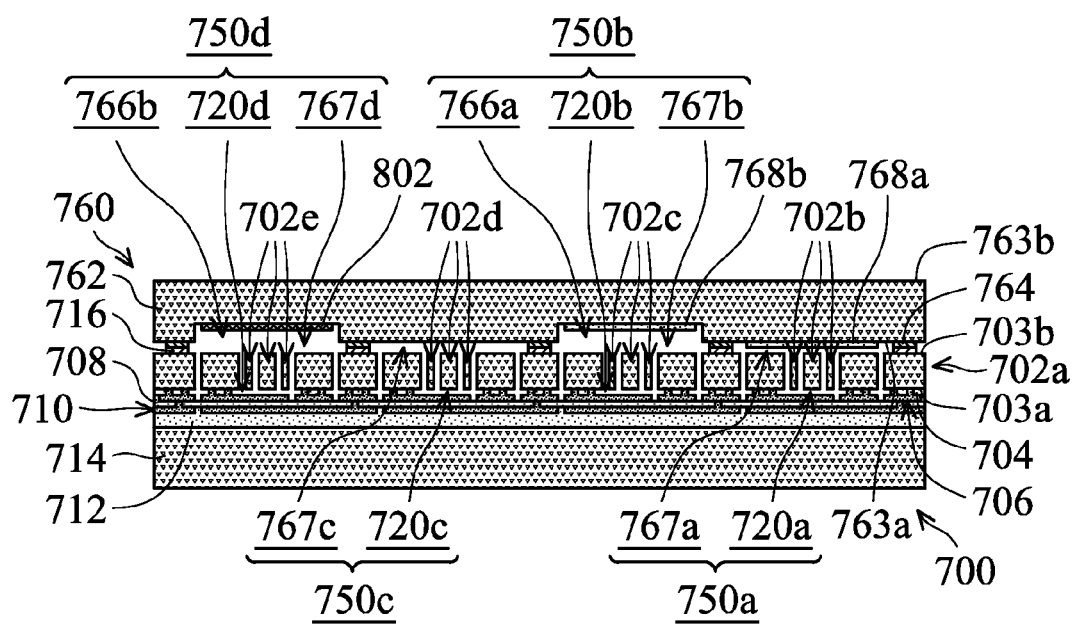

FIGS. 8A-8B are cross-sectional views of various stages of a process for forming a MEMS device, in accordance with some embodiments. As shown in FIG. 8A, a structure similar to that shown in FIG. 7M is provided, in accordance with some embodiments. A gas getter layer 802 is formed in the recess 766b, as shown in FIG. 8A in accordance with some embodiments. The gas getter layer 802 serves as a pressure-changing layer. In some embodiments, the gas getter layer 802 is formed over the bottom of the recess 766b. In some other embodiments, the gas getter layer 802 is formed over the sidewall of the recess 766b. In some other embodiments, the gas getter layer 802 is formed over both of the bottom and the sidewall of the recess 766b.

The gas getter layer 802 is capable of absorbing gas. In some embodiments, the gas getter layer 802 is made of a material that is different from those of the pressure changing layers 768a and 768b (outgassing layers). In some embodiments, the gas getter layer 802 is made of a metal material or another suitable material. The gas getter layer 802 may be made of titanium (Ti), zirconium (Zr), vanadium (V), iron (Fe), another suitable metal material, or a combination thereof. In some embodiments, a gas getter material layer is deposited over the substrate 762 and then patterned to form the gas getter layer 802. In some embodiments, the gas getter material layer is deposited using a PVD process, an electroplating process, a CVD process, a spin-on process, a printing process, another applicable process, or a combination thereof. A photolithography process and an etching process may be used to pattern the gas getter material layer for the formation of the gas getter layer 802. In some embodiments, the gas getter layer 802 is formed after the formation of the pressure-changing layers 768a and 768b. In some other embodiments, the gas getter layer 802 is formed before the formation of the pressure-changing layers 768a and 768b.

As shown in FIG. 8B, similar to the process illustrated in FIG. 7N, the cap substrate 760 is bonded with the MEMS substrate 700 to form the enclosed spaces 750a, 750b, 750c, and 750d, in accordance with some embodiments. As shown in FIG. 8B, the enclosed space 750d contains a pressure-changing layer (the gas getter layer 802) after the bonding between the cap substrate 760 and the MEMS substrate 700. As mentioned above, the gas getter layer 802 is capable of absorbing gas. After the gas in the enclosed space 750d is absorbed by the gas getter layer 802, the pressure in the enclosed space 750d is further decreased. Two or more different pressure-changing layers, which are made of different materials, may be used to adjust the pressures of different enclosed spaces according to requirements.

Figure 9:
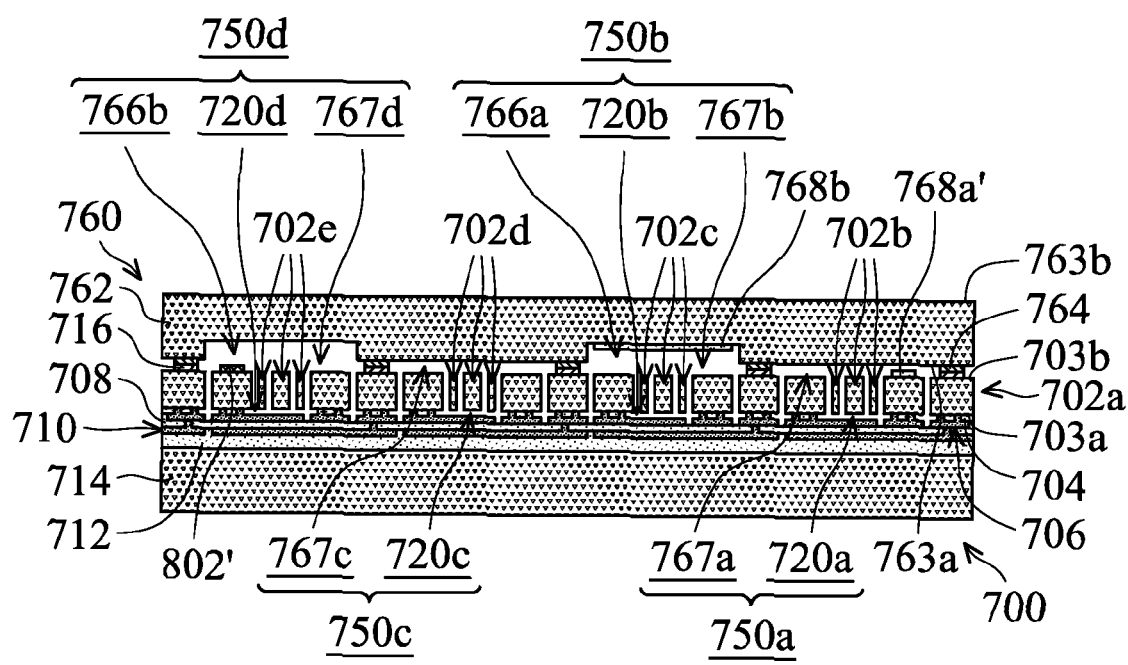
FIG. 9 is a cross-sectional view of a MEMS device, in accordance with some embodiments.

Many variations and modifications can be made to embodiments of the disclosure. For example, the pressure-changing layer is not limited to being on the cap substrate 760. FIG. 9 is a cross-sectional view of a MEMS device, in accordance with some embodiments. As shown in FIG. 9, an outgassing layer 768' (or a pressure-changing layer) and/or a gas getter layer 802' are/is formed over the MEMS substrate 700. In some embodiments, the outgassing layer 768' and/or the gas getter layer 802' are/is in direct contact with the MEMS substrate 700. For example, the outgassing layer 768' and/or the gas getter layer 802' are/is in direct contact with the semiconductor substrate 702. The outgassing layer 768' is used to release gas in the enclosed space 750a. The gas getter layer 802' is used to absorb gas in the enclosed space 750d. As a result, the pressure in the enclosed spaces 750a is increased. The pressure in the enclosed space 750d is decreased. In some embodiments, the outgassing layer 768' and/or the gas getter layer 802' are/is formed over the MEMS substrate 700 before the semiconductor substrate 702 is patterned to form the elements 702a.

Figure 10A:
FIGS. 10A-10P are cross-sectional views of various stages of a process for forming a MEMS device, in accordance with some embodiments.

Many variations and modifications can be made to embodiments of the disclosure. FIGS. 10A-10P are cross-sectional views of various stages of a process for forming a MEMS device, in accordance with some embodiments. As shown in FIG. 10A, a mask layer 810 is deposited over the carrier substrate 714, in accordance with some embodiments. In some embodiments, the mask layer 810 includes a dielectric material, a metal material, another suitable material, or a combination thereof. In some embodiments, the mask layer 810 is made of silicon oxide, silicon nitride, silicon oxynitride, silicon carbide, another suitable material, or a combination thereof. In some embodiments, the mask layer 810 is deposited over the carrier substrate 714 using a CVD process, a spin-on process, a PVD process, a thermal oxidation process, another applicable process, or a combination thereof.

Figure 10B:
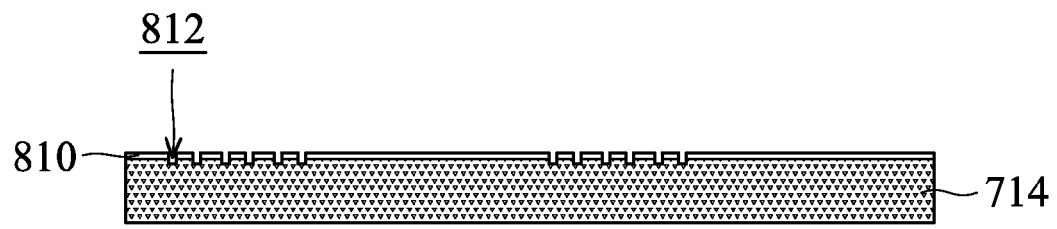

As shown in FIG. 10B, the mask layer 810 is patterned to form multiple holes 812 which expose the carrier substrate 714, in accordance with some embodiments. In some embodiments, a photolithography process and an etching process are used to pattern the mask layer 810. In some embodiments, the holes 812 extend into the carrier substrate 714.

Figure 10C:
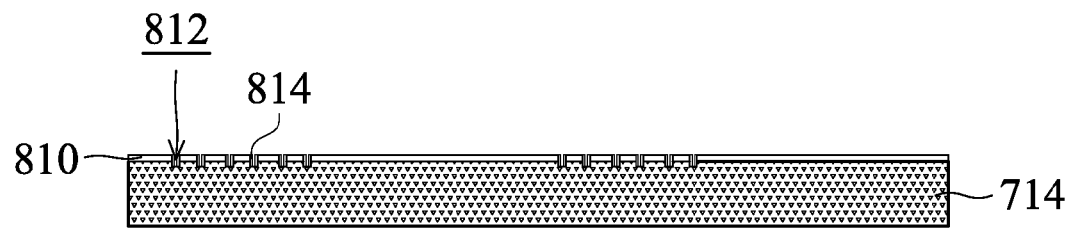

As shown in FIG. 10C, multiple protection elements 814 are formed over sidewalls of the holes 812, in accordance with some embodiments. In some embodiments, the protection elements 814 include a dielectric material, a metal material, another suitable material, or a combination thereof. In some embodiments, the protection elements 814 are made of silicon oxide, silicon nitride, silicon oxynitride, silicon carbide, another suitable material, or a combination thereof.

In some embodiments, a protection layer is deposited over the mask layer 810 and the sidewalls and bottoms of the holes 812. Afterwards, the protection layer is etched back to remove the portions of the protection layers over the mask layer 810 and the bottoms of the holes 812. As a result, the protection elements 814 over the sidewalls of the holes 812 are formed. In some embodiments, the protection layer is deposited using a CVD process, a spin-on process, a PVD process, a thermal oxidation process, another applicable process, or a combination thereof.

Figure 10D:
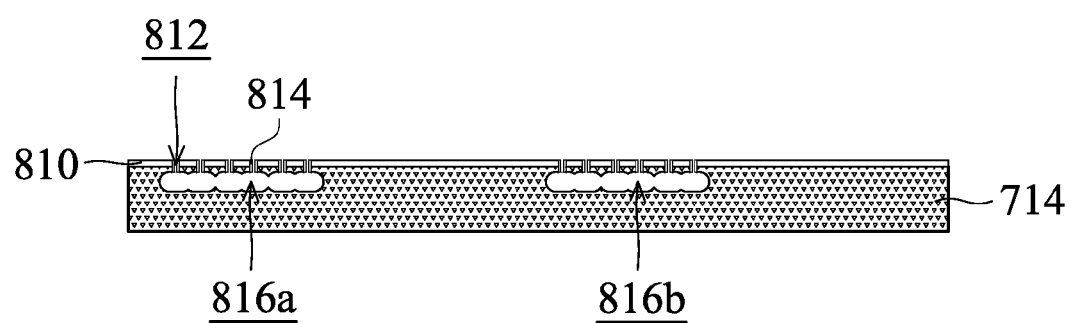
Figure 10E:
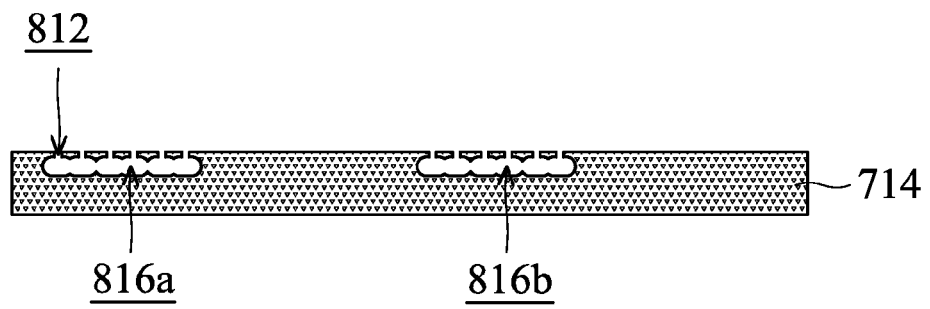

As shown in FIG. 10D, the carrier substrate 714 is etched through the holes 812 to form cavities 816a and 816b, in accordance with some embodiments. In some embodiments, an isotropic etching process is used to form the cavities 816a and 816b. Afterwards, the mask layer 810 and the protection elements 814 are removed, as shown in FIG. 10E in accordance with some embodiments.

Figure 10F:
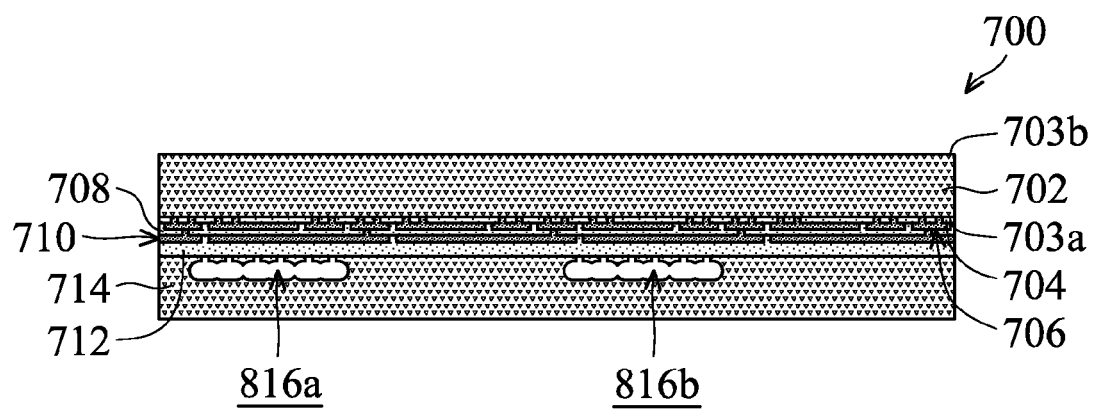

As shown in FIG. 10F, a structure similar to the structure shown in FIG. 7E is flipped upside down and bonded with the carrier substrate 714 which has the cavities 816a and 816b, in accordance with some embodiments. In some embodiments, the carrier substrate 714 is in direct contact with the dielectric layer 712. The bonding between the carrier substrate 714 and the dielectric layer 712 may be achieved by using a fusion bonding process, a eutectic bonding process, a plasma activated bonding process, a thermocompression bonding process, a diffusion bonding process, an anodic bonding process, other applicable processes, or a combination thereof.

Figure 10G:
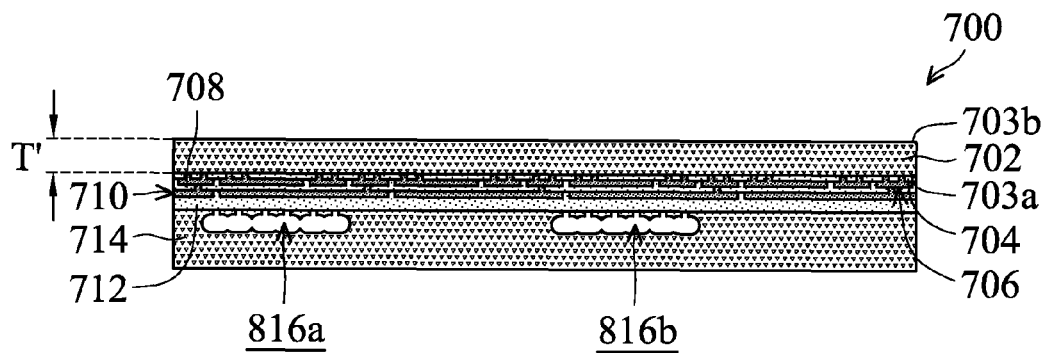

As shown in FIG. 10G, the semiconductor substrate 702 is thinned down from the surface 703b, in accordance with some embodiments. In some embodiments, similar to the embodiments shown in FIG. 7G, a planarization process is performed to thin the semiconductor substrate 702. A suitable planarization process includes, for example, a CMP process, a mechanical grinding process, an etching process, other applicable processes, or a combination thereof. In some embodiments, the semiconductor substrate 702 is thinned using a grinding process, followed by a CMP process.

Figure 10H:
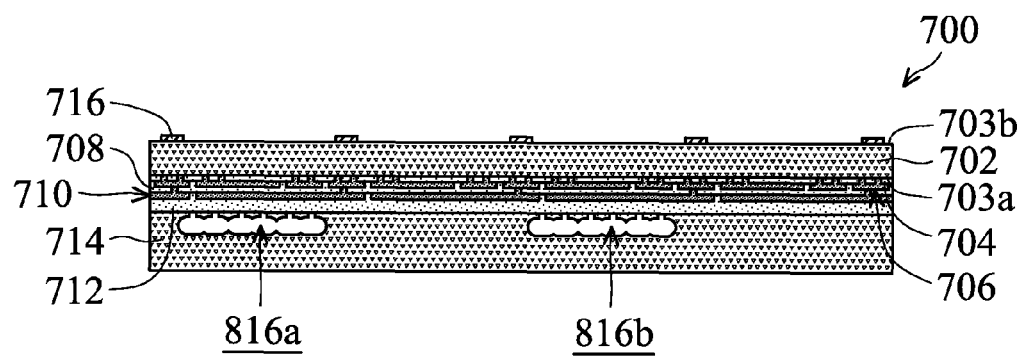

As shown in FIG. 10H, similar to the embodiments shown in FIG. 7H, the bonding elements 716 are formed over the surface 703b of the semiconductor substrate 702, in accordance with some embodiments. In some embodiments, the bonding element 716 is made of a metal material, a semiconductor material, other suitable materials, or a combination thereof. A suitable metal material for forming the bonding element 716 includes, for example, aluminum (Al), copper (Cu), aluminum copper (AlCu), gold (Au), the like, or a combination thereof. A suitable semiconductor material for forming the bonding element 716 includes, for example, germanium or the like. In some embodiments, a bonding material layer is deposited over the semiconductor substrate 702 using a PVD process, a plating process, a CVD process, other applicable processes, or a combination thereof. Afterwards, the bonding material layer is patterned to form the bonding elements 716, as shown in FIG. 10H.

Figure 10I:
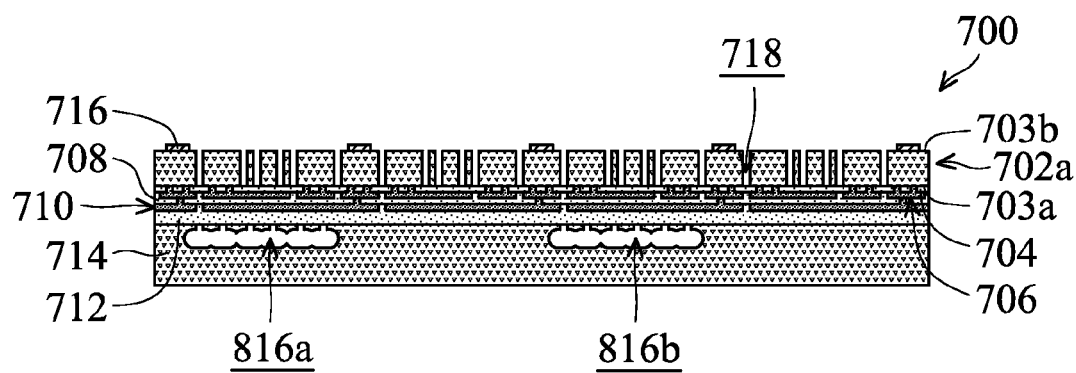

As shown in FIG. 10I, similar to the embodiments shown in FIG. 7I, the semiconductor substrate 702 is patterned to form the elements 702a, in accordance with some embodiments. In some embodiments, the semiconductor substrate 702 is partially removed to form the openings 718. In some embodiments, the openings 718 expose the dielectric layer 704. For example, a photolithography process and an etching process are used to partially remove the semiconductor substrate 702. In some embodiments, some of the elements 702a connect with each other, and some of other elements do not.

Figure 10J:
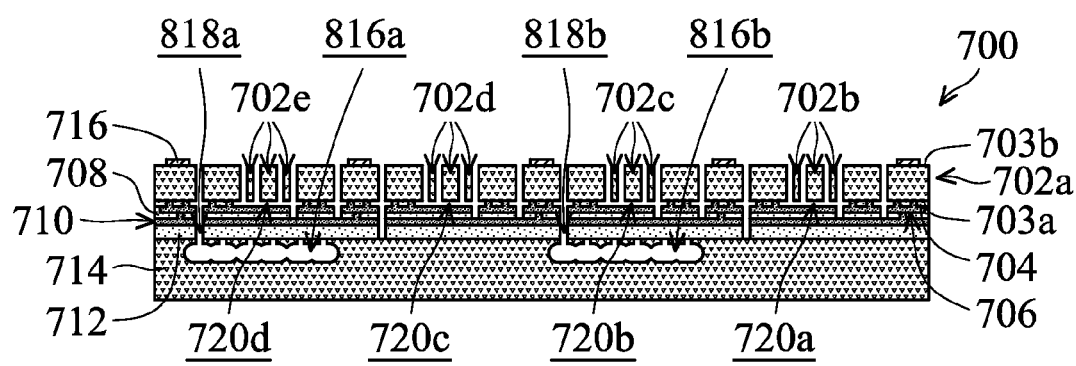

As shown in FIG. 10J, like in the embodiments shown in FIG. 7J, a portion of the dielectric layer 704 is removed through the openings 718 to form the cavities 720a, 720b, 720c, and 720d, in accordance with some embodiments. For example, an etching process is used to partially remove the dielectric layer 704. In some embodiments, a portion of the dielectric layer 708 is also removed. After the cavities 720a, 720b, 720c, and 720d are formed, some of the elements 702a are released from the dielectric layer 704 and are free to move. As a result, the movable elements 702b, 702c, 702d, and 702e are formed, as shown in FIG. 10J.

As shown in FIG. 10J, holes 818a and 818b are formed to connect the cavities 816a and 816b, in accordance with some embodiments. In some embodiments, the same etching process is used to form the holes 818a and 818b and the cavities 720a, 720b, 720c, and 720d. In other words, the holes 818a and 818b and the cavities 720a, 720b, 720c, and 720d are formed simultaneously in some embodiments.

Figure 10K:
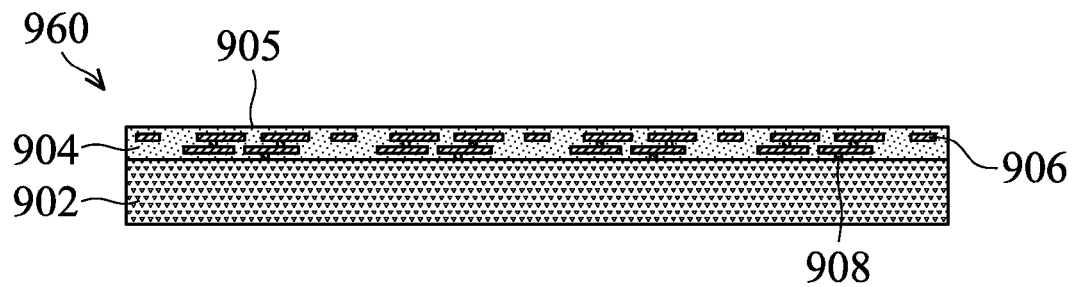

As shown in FIG. 10K, a cap substrate 960 is provided. In some embodiments, the cap substrate 960 includes a complimentary metal-oxide-semiconductor (CMOS) substrate. The cap substrate 960 includes a semiconductor substrate 902 having a number of device elements including CMOS devices (not shown). An interconnect structure is formed over the semiconductor substrate 902. The interconnect structure includes a dielectric layer 904 and interconnect features formed in the dielectric layer 904.

In some embodiments, the interconnect features include horizontal conductive lines 906 and vertical conductive plugs 908 (or conductive vias). The interconnect features are electrically connected to the corresponding device elements of the CMOS substrate. In some embodiments, the interconnect features are made of copper, aluminum, tungsten, nickel, titanium, other suitable materials, or a combination thereof.

In some embodiments, the dielectric layer 904 is made of silicon oxide or another suitable material. The dielectric layer 904 may include multiple dielectric layers. In some embodiments, a dielectric material layer is deposited and planarized to provide the dielectric layer 904 with a substantially planar surface 905. In some embodiments, the dielectric layer 904 is formed using a CVD process, a spin-on process, another applicable process, or a combination thereof. In some embodiments, the dielectric layer 904 is formed at a temperature lower than about 500 degrees C. Therefore, the conductive lines 906 and the conductive plugs 908 are prevented from being damaged. Since the dielectric layer 904 of the CMOS substrate is not annealed at a temperature higher than about 500 degrees C., the dielectric layer 904 also serves as a pressure-changing layer or an outgassing layer. In some embodiments, the dielectric layer 904 releases gas when it is positioned in a vacuumized space.

Figure 10L:
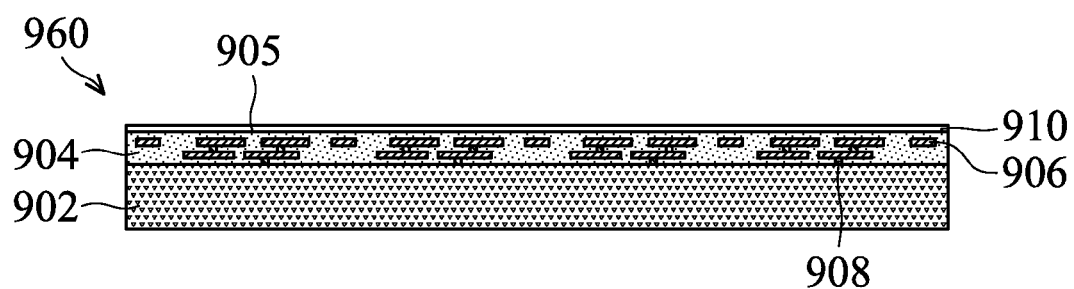

As shown in FIG. 10L, a gas-blocking layer 910 is deposited over the surface 905 of the dielectric layer 904, in accordance with some embodiments. In some embodiments, the gas-blocking layer 910 is made of a dielectric material, a semiconductor material, another suitable material, or a combination thereof. In some embodiments, the gas-blocking layer 910 is made of silicon nitride. In some embodiments, the gas-blocking layer 910 is a low stress silicon nitride layer. The stress of the gas-blocking layer 910 may be in a range from about −50 MPa to about 50 MPa. In some embodiments, the gas-blocking layer 910 is deposited using a CVD process or other applicable processes.

Figure 10M:
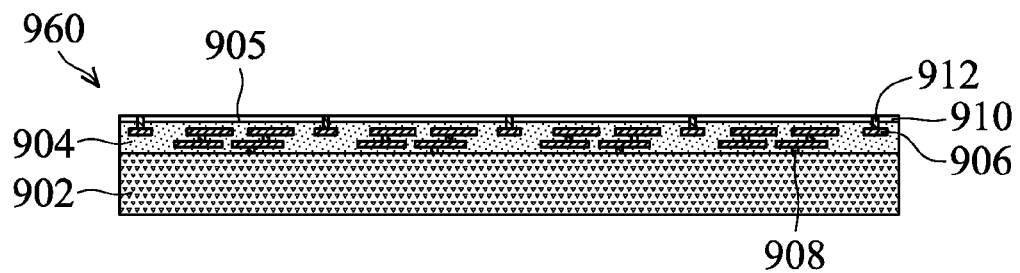

As shown in FIG. 10M, the gas-blocking layer 910 is patterned to form contact holes, in accordance with some embodiments. In some embodiments, conductive plugs 912 are formed in the contact holes to form electrical connections to the device elements of the CMOS substrate through the interconnect features. In some embodiments, the conductive plugs 912 are made of tungsten, copper, another suitable material, or a combination thereof. In some embodiments, the conductive plugs 912 are formed using a PVD process, a plating process, a CVD process, another applicable process, or a combination thereof. A planarization process may also be performed to finish the formation of the conductive plugs 912.

Figure 10N:
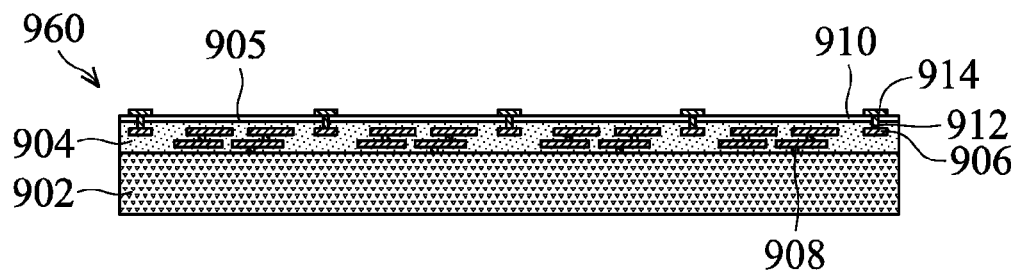

As shown in FIG. 10N, bonding elements 914 are formed over the gas-blocking layer 910, in accordance with some embodiments. In some embodiments, the bonding elements 914 are in direct contact with the corresponding conductive plugs 912, respectively. In some embodiments, an intermediate layer (not shown) is formed between the conductive plug 912 and the bonding element 914. In some embodiments, the bonding elements 914 are made of a semiconductor material, a metal material, other suitable materials, or a combination thereof. For example, the bonding elements 914 are made of germanium or gold.

Figure 10O:
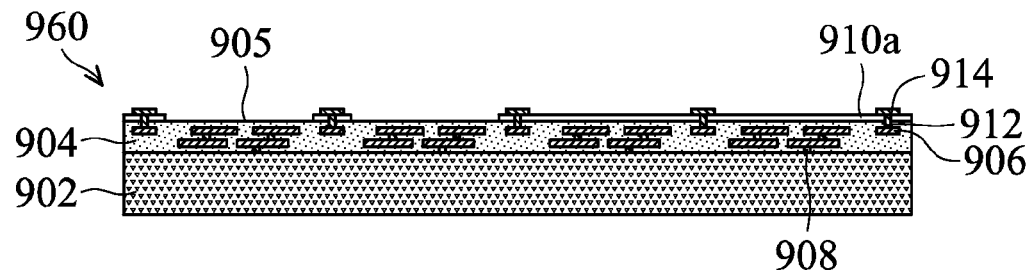
Figure 10P:
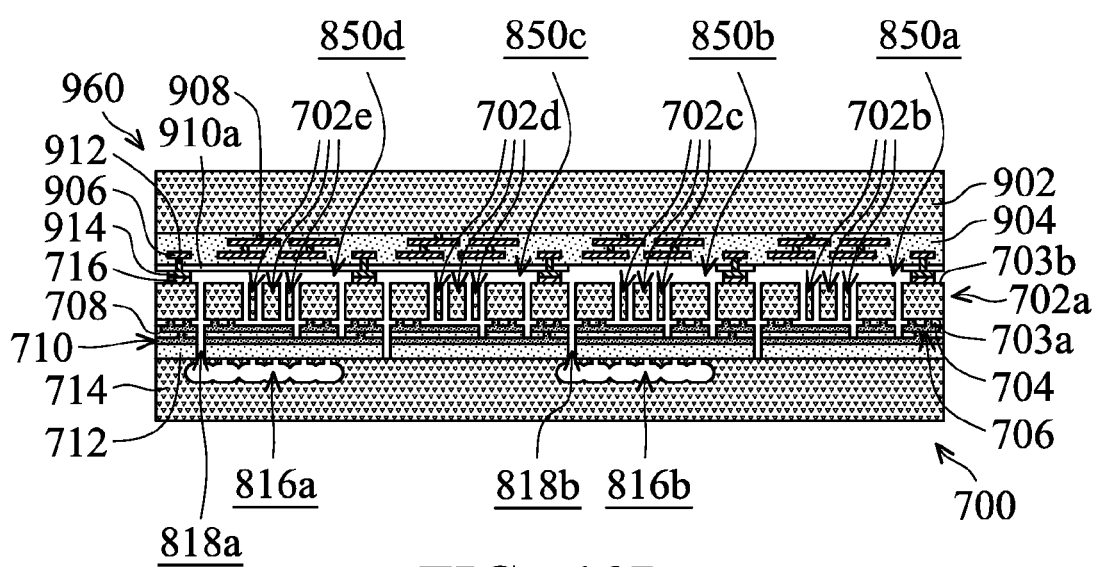

As shown in FIG. 10O, the gas-blocking layer 910 is patterned to form a patterned gas-blocking layer 910a, in accordance with some embodiments. The patterned gas-blocking layer 910a has openings which expose the surface 905 of the dielectric layer 904, as shown in FIG. 10O. In some embodiments, a photolithography process and an etching process are used to form the patterned gas-blocking layer 910a. In some embodiments, the etchant used for patterning the gas-blocking layer 910 substantially does not damage the bonding elements 914.

As shown in FIG. 10P, the cap substrate 960 is bonded with a MEMS substrate, such as the MEMS substrate 700 shown in FIG. 10J, in accordance with some embodiments. Similar to the enclosed spaces 750a, 750b, 750c, and 750d illustrated in FIG. 7N, enclosed spaces 850a, 850b, 850c, and 850d are formed after the bonding process. As shown in FIG. 10P, the movable elements 702b, 702c, 702d, and 702e are between the carrier substrate 714 and the cap substrate 960. In some embodiments, the enclosed space 850b includes the hole 818b and the cavity 816b, and the enclosed space 850d includes the hole 818a and the cavity 816a, as shown in FIG. 10P. The enclosed space 850b and the enclosed space 850d further extend into the carrier substrate 714, as shown in FIG. 10P in accordance with some embodiments.

In some embodiments, the cap substrate 960 is bonded with the MEMS substrate 700 through the bonding elements 716 and 914. In some embodiments, the cap substrate 960 and the MEMS substrate 700 are bonded together by using a eutectic bonding process, a plasma activated bonding process, a thermocompression bonding process, a diffusion bonding process, an anodic bonding process, other applicable processes, or a combination thereof. In some embodiments, the bonding element 716 is made of a metal material, such as aluminum copper, and the bonding element 914 is made of a semiconductor material, such as germanium. In some other embodiments, both of the bonding elements 716 and 914 are made of a metal material, such as gold.

Similarly, the pressures in the enclosed spaces 850a, 850b, 850c, and 850d are substantially the same as the predetermined pressure in the process chamber of the bonding tool right after the bonding process. Afterwards, the dielectric layer 904, which faces the enclosed space 850a and 850b and also serves as a pressure-changing layer or an outgassing layer, in the enclosed space 850a and 850b could release some gas. As a result, the pressure in the enclosed spaces 850a and 850b are changed. In some embodiments, the pressure in the enclosed spaces 850a and 850b are increased due to the outgassing of the dielectric layer 904. In some embodiments, the dielectric layer 904 is heated to induce the outgassing. In some embodiments, the dielectric layer 904 releases some gas without being further heated. In some embodiments, the pressure in the enclosed space 850a is greater than that in the enclosed space 850b since the enclosed space 850b is larger than the enclosed space 850a.

In some embodiments, the patterned gas-blocking layer 910a is between the dielectric layer 904 and the enclosed spaces 850c and 850d. The patterned gas-blocking layer 910a may separate the outgassing layer (the dielectric layer 904) of the cap substrate 960 from the enclosed spaces 850c and 850d. Therefore, outgassing from the dielectric layer 904 is blocked from entering the enclosed spaces 850c and 850d. The degree of vacuum of the enclosed spaces 850c and 850d may be substantially maintained.

In some embodiments, the pressure in the enclosed space 850c is higher than that in the enclosed space 850d. After the bonding process, the pressures in the enclosed spaces 850c and 850d are initially the same. Afterwards, a slight amount of gas trapped in the materials surrounding the enclosed spaces 850c and 850d may be released. This is because the enclosed space 850d is larger than the enclosed space 850c. As a result, the pressure in the enclosed space 850c is higher than that in the enclosed space 850d after the trapped gas is released. However, embodiments of the disclosure are not limited thereto. In some other embodiments, the pressures in the enclosed spaces 850c and 850d are substantially the same.

In some embodiments, the pressure in the enclosed space 850a or 850b is in a range from about 50 torrs to about 760 torrs. In some embodiments, the pressure in the enclosed space 850c or 850d is in a range from about 0.01 torr to about 10 torrs. In some embodiments, the movable elements 702b and/or 702c in the enclosed space 850a and/or 850b are used for accelerometer applications. In some embodiments, the movable elements 702d and/or 702e in the enclosed space 850c and/or 850d are used for gyro applications and/or resonator applications.

Many variations and modifications can be made to embodiments of the disclosure. In some embodiments, the pressure-changing layer is a gas getter layer which is capable of absorbing gas. In some other embodiments, two or more kinds of pressure-changing layer are formed in the MEMS device. For example, both the gas getter layer and the outgassing layer are used.

Figure 11A:
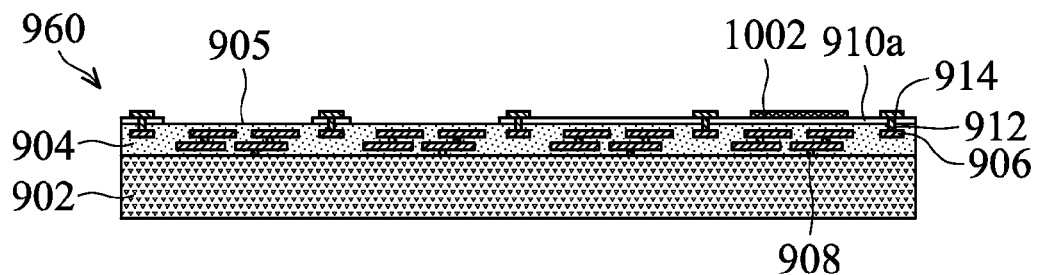
FIGS. 11A-11B are cross-sectional views of various stages of a process for forming a MEMS device, in accordance with some embodiments.
Figure 11B:
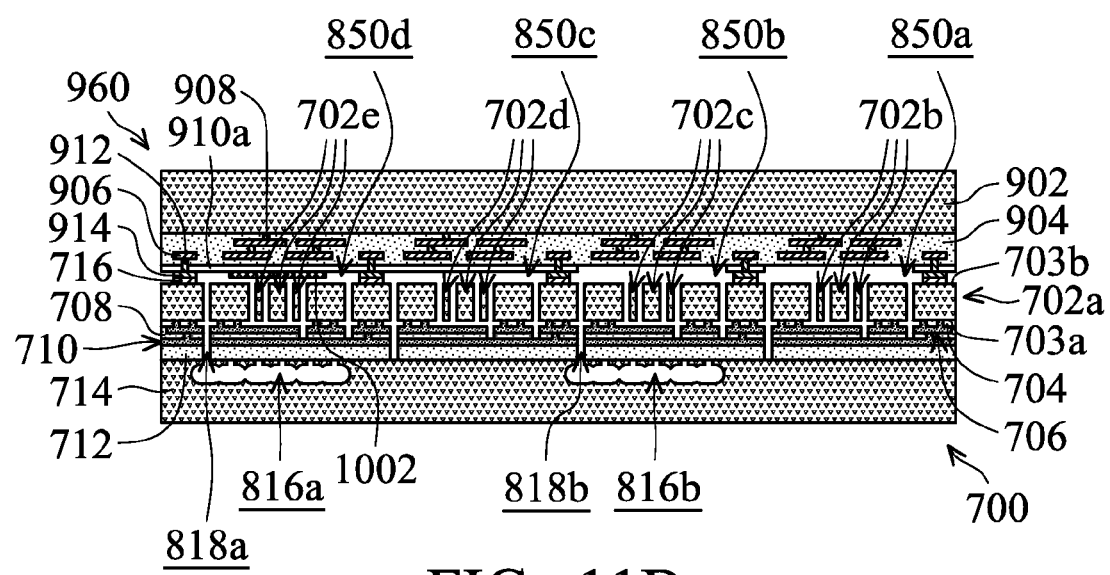

FIGS. 11A-11B are cross-sectional views of various stages of a process for forming a MEMS device, in accordance with some embodiments. As shown in FIG. 11A, a structure similar to that shown in FIG. 10O is provided, in accordance with some embodiments. A gas getter layer 1002 is formed over the patterned gas blocking layer 910a, as shown in FIG. 11A in accordance with some embodiments. The gas getter layer 1002 serves as a pressure-changing layer. The gas getter layer 1002 is capable of absorbing gas. In some embodiments, the material and formation method of the gas getter layer 1002 are similar to those of the gas getter layer 802.

As shown in FIG. 11B, similar to the process illustrated in FIG. 10P, the cap substrate 960 is bonded with the MEMS substrate 700 to form the enclosed spaces 850a, 850b, 850c, and 850d, in accordance with some embodiments. As shown in FIG. 11B, the enclosed space 850d contains a pressure-changing layer (the gas getter layer 1102) after the bonding between the cap substrate 960 and the MEMS substrate 700. As mentioned above, the gas getter layer 1002 is capable of absorbing gas. After the gas in the enclosed space 850d is absorbed by the gas getter layer 1002, the pressure in the enclosed space 850d is further decreased. Two or more different pressure-changing layers, which have different materials, may be used to adjust the pressures in different enclosed spaces according to requirements.

Figure 12:
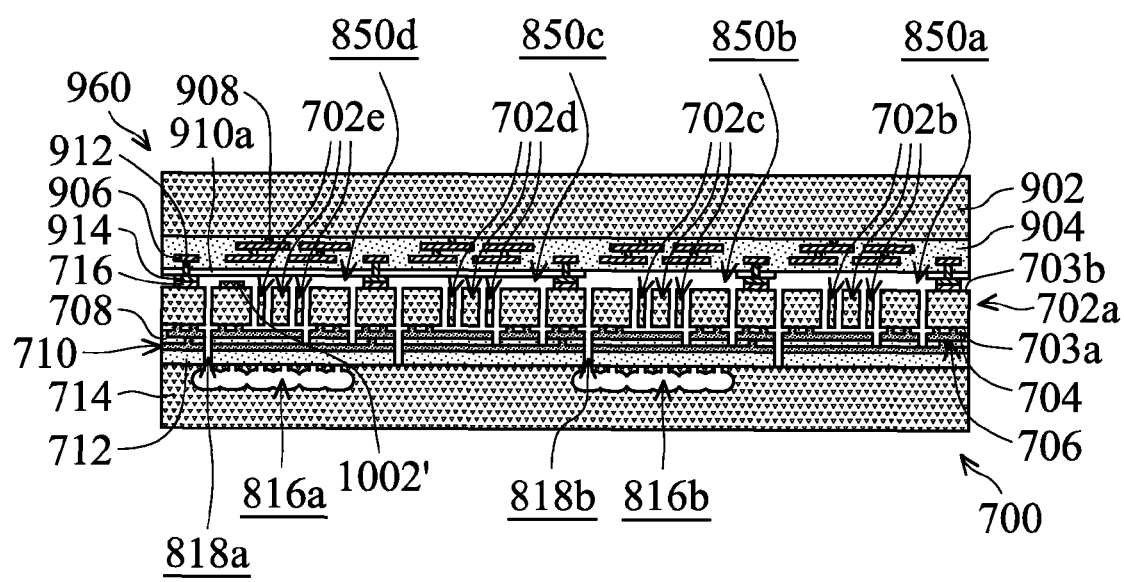
FIG. 12 is a cross-sectional view of a MEMS device, in accordance with some embodiments.

Many variations and modifications can be made to embodiments of the disclosure. For example, the pressure-changing layer is not limited to being on the cap substrate 960. FIG. 12 is a cross-sectional view of a MEMS device, in accordance with some embodiments. As shown in FIG. 12, a pressure-changing layer such as a gas getter layer 1002' is formed over the MEMS substrate 700. In some embodiments, the gas getter layer 1002' is in direct contact with the MEMS substrate 700. For example, the gas getter layer 1002' is in direct contact with the semiconductor substrate 702. The gas getter layer 1002' is used to absorb gas in the enclosed space 850d. As a result, the pressure in the enclosed space 850d is decreased. In some embodiments, the gas getter layer 1002' is formed over the MEMS substrate 700 before the semiconductor substrate 702 is patterned to form the elements 702a.

Embodiments of the disclosure form a MEMS device having two or more enclosed spaces containing movable elements. One or more pressure-changing layers such as an outgassing layer and/or a gas getter layer is/are formed in some of the enclosed spaces. The outgassing layer could release some gas in the vacuumized and enclosed space such that the pressure in the corresponding enclosed space is increased. The gas getter layer could absorb some gas such that the pressure in the corresponding enclosed space is decreased. The enclosed spaces may also be formed to have different volumes to assist in tuning the pressures thereof. The movable elements positioned in the enclosed spaces with different pressures could therefore provide different functions. The pressure in the enclosed space is changed after the enclosed space is formed. The enclosed space is not open and sealed to achieve a different pressure. Fabrication cost and time are reduced significantly.

In accordance with some embodiments, a micro-electro mechanical system (MEMS) device is provided. The MEMS device includes a cap substrate and a MEMS substrate bonded with the cap substrate. The MEMS substrate includes a first movable element and a second movable element. The MEMS device also includes a first enclosed space surrounded by the MEMS substrate and the cap substrate, and the first movable element is in the first enclosed space. The MEMS device further includes a second enclosed space surrounded by the MEMS substrate and the cap substrate, and the second movable element is in the second enclosed space. In addition, the MEMS device includes a pressure-changing layer in the first enclosed space.

In accordance with some embodiments, a MEMS device is provided. The MEMS device includes a cap substrate and a MEMS substrate bonded with the cap substrate. The MEMS substrate includes a first movable element and a second movable element. The MEMS device also includes a first enclosed space surrounded by the MEMS substrate and the cap substrate, and the first movable element is in the first enclosed space. The MEMS device further includes a second enclosed space surrounded by the MEMS substrate and the cap substrate, and the second movable element is in the second enclosed space. The first enclosed space is larger than the second enclosed space. In addition, the MEMS device includes a gas getter layer in the first enclosed space.

In accordance with some embodiments, a method for forming a MEMS device is provided. The method includes forming a MEMS substrate, and the MEMS substrate includes a first movable element and a second movable element. The method also includes bonding a cap substrate with the MEMS substrate to surround a first enclosed space and a second enclosed space. The first movable element is in the first enclosed space and the second movable element is in the second enclosed space. The method further includes changing the pressure in the first enclosed space to be a first pressure after the first enclosed space is formed. The first pressure and a second pressure in the second enclosed space are different from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electro mechanical system (MEMS) device, comprising:
a cap substrate;
a MEMS substrate bonded with the cap substrate, wherein the MEMS substrate comprises a first movable element and a second movable element;
a first enclosed space surrounded by the MEMS substrate and the cap substrate, wherein the first movable element is in the first enclosed space;
a second enclosed space surrounded by the MEMS substrate and the cap substrate, wherein the second movable element is in the second enclosed space, a volume of the first enclosed space is larger than a volume of the second enclosed space, and a pressure in the first enclosed space is smaller than a pressure in the second enclosed space;
a pressure-changing layer in one of the first enclosed space and the second enclosed space; and
a surrounding blocking layer surrounding the first enclosed space and the second enclosed space, wherein the surrounding blocking layer surrounds sidewalls of the first enclosed space and the second enclosed space, and the surrounding blocking layer is configured to block gas outside of the first enclosed space and the second enclosed space from entering the first enclosed space and the second enclosed space.

2. The MEMS device as claimed in claim 1, wherein the pressure-changing layer is an outgassing layer.

3. The MEMS device as claimed in claim 1, wherein the pressure-changing layer is a gas getter layer.

4. The MEMS device as claimed in claim 1, further comprising a third enclosed space surrounded by the MEMS substrate and the cap substrate, wherein the MEMS substrate further comprises a third movable element, and the third movable element is in the third enclosed space.

5. The MEMS device as claimed in claim 4, wherein two or all of the first enclosed space, the second enclosed space, and the third enclosed space have different volumes.

6. The MEMS device as claimed in claim 4, further comprising a second pressure-changing layer in the third enclosed space, wherein materials of the pressure-changing layer and the second pressure-changing layer are different.

7. The MEMS device as claimed in claim 4, wherein the cap substrate comprises an outgassing layer facing the first enclosed space, the second enclosed space, and the third enclosed space.

8. The MEMS device as claimed in claim 7, further comprising a gas-blocking layer between the cap substrate and the MEMS substrate, wherein the gas-blocking layer separates the outgassing layer of the cap substrate from at least one of the first enclosed space, the second enclosed space, or the third enclosed space.

9. The MEMS device as claimed in claim 1, further comprising a carrier substrate and a dielectric layer, wherein the first movable element and the second movable element are between the carrier substrate and the cap substrate, the dielectric layer is between the carrier substrate and the MEMS substrate, and one of the first enclosed space and the second enclosed space has an extending portion that extends through the dielectric layer and further extends into the carrier substrate such that a portion of the extending portion is between the carrier substrate and the dielectric layer.

10. A micro-electro mechanical system (MEMS) device, comprising:
a cap substrate;
a MEMS substrate bonded with the cap substrate, wherein the MEMS substrate comprises a first movable element and a second movable element;
a first enclosed space surrounded by the MEMS substrate and the cap substrate, wherein the first movable element is in the first enclosed space;
a second enclosed space surrounded by the MEMS substrate and the cap substrate, wherein the second movable element is in the second enclosed space, and the first enclosed space is larger than the second enclosed space;
a gas getter layer in the first enclosed space; and
a surrounding blocking layer surrounding the first enclosed space and the second enclosed space, wherein the surrounding blocking layer surrounds sidewalls of the first enclosed space and the second enclosed space, and the surrounding blocking layer is configured to block as outside of the first enclosed space and the second enclosed space from entering the first enclosed space and the second enclosed space.

11. The MEMS device as claimed in claim 10, further comprising a third enclosed space surrounded by the MEMS substrate and the cap substrate, wherein the MEMS substrate further comprises a third movable element, and the third movable element is in the third enclosed space.

12. The MEMS device as claimed in claim 11, further comprising an outgassing layer in the third enclosed space.

13. The MEMS device as claimed in claim 12, wherein the first enclosed space is larger than the third enclosed space.

14. The MEMS device as claimed in claim 11, wherein the cap substrate comprises an outgassing layer facing the MEMS substrate, the MEMS device further comprises a gas-blocking layer between the cap substrate and the MEMS substrate, and the gas-blocking layer separates the outgassing layer of the cap substrate from the first enclosed space.

15. The MEMS device as claimed in claim 1, wherein a first pressure in the first enclosed space and a second pressure in the second enclosed space are different from each other.

16. The MEMS device as claimed in claim 3, wherein the gas getter layer is in direct contact with the MEMS substrate.

17. The MEMS device as claimed in claim 3, wherein the cap substrate further comprises a recess, the gas getter layer is on a bottom or a sidewall of the recess, and the recess is a portion of the first enclosed space.

18. The MEMS device as claimed in claim 10, further comprising an outgassing layer on the cap substrate, wherein the outgassing layer is in the second enclosed space.

19. The MEMS device as claimed in claim 14, wherein the gas getter layer is in direct contact with the gas-blocking layer or the MEMS substrate.

20. A micro-electro mechanical system (MEMS) device, comprising:
a CMOS substrate;
a cap substrate;
a MEMS substrate bonded between the cap substrate and the CMOS substrate, wherein the MEMS substrate comprises a first movable element and a second movable element;
a first enclosed space surrounded by the MEMS substrate and the cap substrate, wherein the first movable element is in the first enclosed space;

a second enclosed space surrounded by the MEMS substrate and the cap substrate, wherein the second movable element is in the second enclosed space;

a pressure-changing layer in the first enclosed space; and a surrounding blocking layer surrounding the first enclosed space and the second enclosed space, wherein the surrounding blocking layer extends towards the CMOS substrate and the cap substrate and surrounds sidewalls of the first enclosed space and the second enclosed space, and the surrounding blocking layer is configured to block gas outside of the first enclosed space and the second enclosed space from entering the first enclosed space and the second enclosed space.

* * * * *